United States Patent
Kwon et al.

(10) Patent No.: US 12,435,075 B2
(45) Date of Patent: Oct. 7, 2025

(54) COMPOUND, FILM, SENSOR, AND ELECTRONIC DEVICE

(71) Applicant: Samsung Electronics Co., Ltd., Suwon-si (KR)

(72) Inventors: Ohkyu Kwon, Seoul (KR); Rae Sung Kim, Hwaseong-si (KR); Dong-Seok Leem, Seongnam-si (KR); Sangdong Kim, Seongnam-si (KR); Insun Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 514 days.

(21) Appl. No.: 17/939,216

(22) Filed: Sep. 7, 2022

(65) Prior Publication Data
US 2023/0125778 A1  Apr. 27, 2023

(30) Foreign Application Priority Data
Oct. 27, 2021 (KR) .................. 10-2021-0144458

(51) Int. Cl.
*H10K 50/125* (2023.01)
*C07D 409/04* (2006.01)
*C07D 409/14* (2006.01)
*H10H 20/851* (2025.01)
(Continued)

(52) U.S. Cl.
CPC ......... *C07D 409/14* (2013.01); *C07D 409/04* (2013.01); *H10H 20/8512* (2025.01); *H10K 30/00* (2023.02); *H10K 50/125* (2023.02); *H10K 85/655* (2023.02)

(58) Field of Classification Search
None
See application file for complete search history.

(56) References Cited

U.S. PATENT DOCUMENTS

| | | | |
|---|---|---|---|
| 7,285,663 B2 | 10/2007 | Heckmann et al. | |
| 2018/0315933 A1 | 11/2018 | Han et al. | |
| 2022/0135549 A1 | 5/2022 | Zeika et al. | |

FOREIGN PATENT DOCUMENTS

| | | |
|---|---|---|
| DE | 10302020 A1 | 7/2004 |
| DE | 102013203149 A1 | 9/2013 |
| EP | 3960738 A1 | 3/2022 |

(Continued)

OTHER PUBLICATIONS

Extended European Search Report dated Feb. 27, 2023 for corresponding European Application No. 22201039.9.

(Continued)

*Primary Examiner* — Anthony Ho
(74) *Attorney, Agent, or Firm* — Harness, Dickey & Pierce, P.L.C.

(57) ABSTRACT

Disclosed are a compound represented by Chemical Formula 1, and a film, an infrared sensor, and an electronic device including the compound.

[Chemical Formula 1]

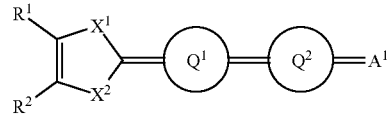

In Chemical Formula 1, $Q^1$, $Q^2$, $X^1$, $X^2$, $R^1$, $R^2$, and $A^1$ are the same as in the specification.

14 Claims, 14 Drawing Sheets

(51) Int. Cl.
*H10K 30/00* (2023.01)
*H10K 85/60* (2023.01)

(56) References Cited

FOREIGN PATENT DOCUMENTS

WO    WO-16124694 A1    8/2016
WO    WO-2020/239456 A1    12/2020

OTHER PUBLICATIONS

Enchev Venelin et al., "A model system with intramolecular hydrogen bonding: Effect of external electric field on the tautomeric conversion and electronics structures", Computational and Theoretical Chemistry, vol. 1006, Feb. 1, 2013, pp. 113-122, XP093024855, DOI: 10.1016/j.comptc.2012.11.021.

COMPOUND, FILM, SENSOR, AND ELECTRONIC DEVICE

CROSS-REFERENCE TO RELATED APPLICATION

This application claims priority to and the benefit of Korean Patent Application No. 10-2021-0144458 filed in the Korean Intellectual Property Office on Oct. 27, 2021, the entire contents of which are incorporated herein by reference.

BACKGROUND

1. Field

Examples embodiments relate to compounds, films, sensors, and electronic devices.

2. Description of the Related Art

An imaging device is used in a digital camera and a camcorder, etc., to capture an image and to store the captured image as an electrical signal, and the imaging device includes a sensor separating incident light according to a wavelength and converting each component to an electrical signal.

SUMMARY

Some example embodiments provide a compound that exhibits good light absorption characteristics in an infrared wavelength region and electrical characteristics.

Some example embodiments provide a film including the compound.

Some example embodiments provide a sensor including the compound or the film. Such a sensor may, based on including the compound or film, be configured to sense light in an infrared (IR) wavelength with improved sensitivity in a low illumination device. Such a sensor may be used as a biometric sensor device and/or as a security device.

Some example embodiments provide an electronic device including the compound, the film, or the sensor.

According to some example embodiments, a compound represented by Chemical Formula 1 is provided.

[Chemical Formula 1]

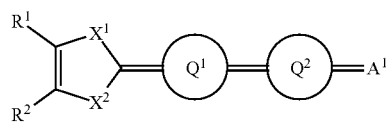

In Chemical Formula 1, $Q^1$ and $Q^2$ are each independently a substituted or unsubstituted C3 to C30 quinoid ring, $X^1$ and $X^2$ are each independently O, S, Se, Te, or $NR^a$, $R^1$, $R^2$, and $R^a$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^1$ and $R^2$ are each independently present or are combined with each other to form a ring, and $A^1$ is a cyclic group represented by Chemical Formula A,

[Chemical Formula A]

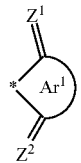

wherein, in Chemical Formula A, $Ar^1$ is a substituted or unsubstituted C6 to C30 aryl group, a substituted or unsubstituted C3 to C30 heteroaryl group, or a fused ring thereof, $Z^1$ and $Z^2$ are each independently O, S, Se, Te, or $CR^bR^c$, wherein $R^b$ and $R^c$ are each independently hydrogen, a substituted or unsubstituted C1 to C30 alkyl group, or a cyano group, and

* is a linking point with Chemical Formula 1.

$Q^1$ and $Q^2$ may each independently include at least one substituted or unsubstituted 5-membered quinoid ring, at least one substituted or unsubstituted 6-membered quinoid ring, or a fused ring thereof.

$Q^1$ and $Q^2$ may each independently include one selected from the groups listed in Group 1 (e.g., may each independently be one group of a plurality of groups listed in Group 1).

[Group 1]

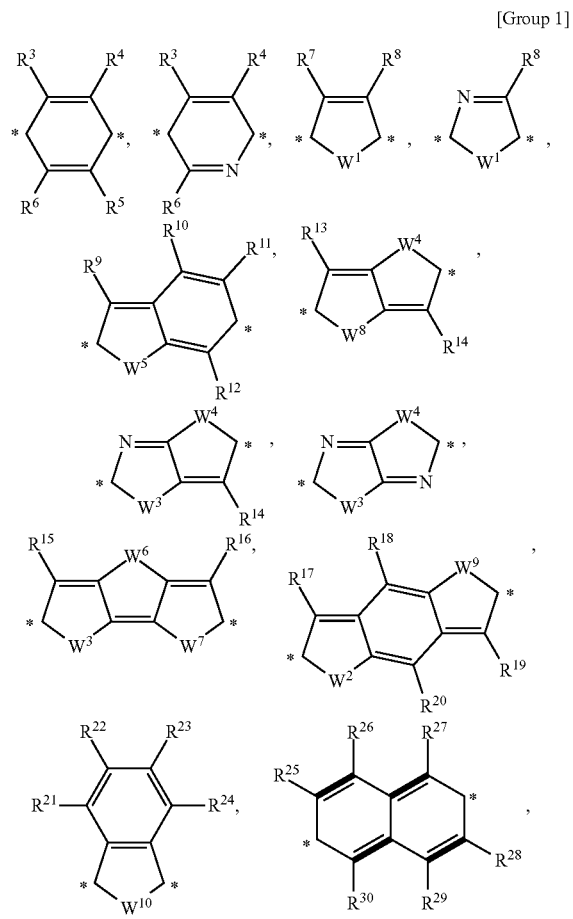

-continued

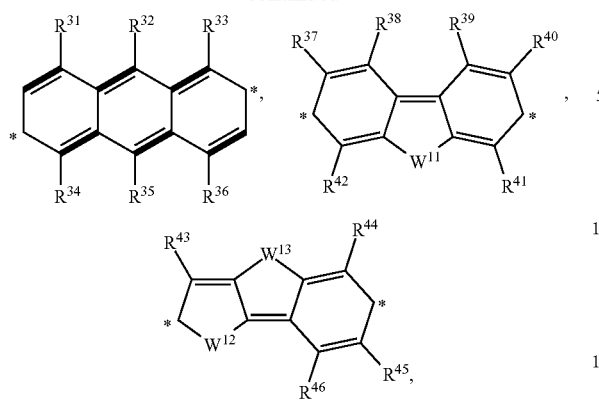

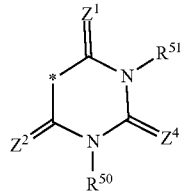

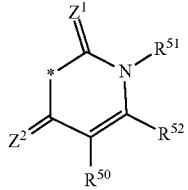

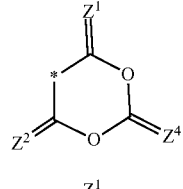

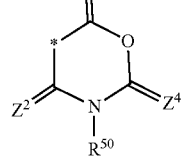

wherein, in Group 1, $W^1$ to $W^{13}$ are each independently O, S, Se, or Te, $R^3$ to $R^{46}$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^3$ to $R^{46}$ are each independently present or two adjacent ones of $R^3$ to $R^{46}$ are linked to each other to form a ring, and

* is a linking point with Chemical Formula 1.

$X^1$ and $X^2$ may each be S.

$A^1$ may be represented by one of Chemical Formulas A-1 to A-7.

[Chemical Formula A-1]

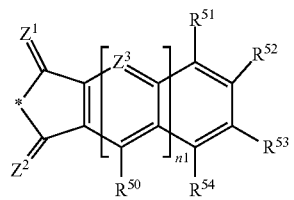

[Chemical Formula A-2]

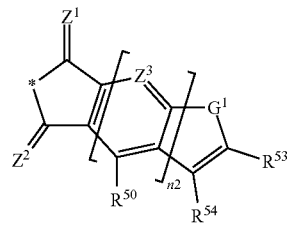

[Chemical Formula A-3]

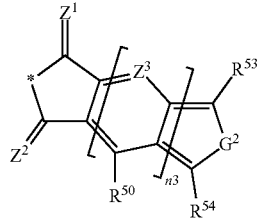

[Chemical Formula A-4]

[Chemical Formula A-5]

[Chemical Formula A-6]

[Chemical Formula A-7]

wherein, in Chemical Formulas A-1 to A-7, $Z^1$, $Z^2$, and $Z^4$ are each independently O, S, Se, Te, or $CR^bR^c$, wherein $R^b$ and $R^c$ are each independently hydrogen, a substituted or unsubstituted C1 to C30 alkyl group, or a cyano group, $Z^3$ is N or $CR^d$, $G^1$ and $G^2$ are each independently O, S, Se, or Te, $R^{50}$ to $R^{54}$ and $R^d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^{50}$ to $R^{54}$ are each independently present or two adjacent ones of $R^{50}$ to $R^{54}$ are linked to each other to form a ring, n1 to n3 are each independently an integer of 0 to 2, and

* is a linking point with Chemical Formula 1.

$A^1$ may be represented by one of Chemical Formulas A-1a to A-7b.

[Chemical Formula A-1a]

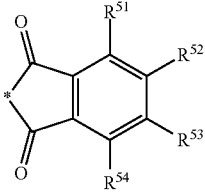

[Chemical Formula A-1b]
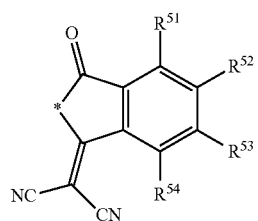
[Chemical Formula A-1c]
[Chemical Formula A-1d]
[Chemical Formula A-2a]
[Chemical Formula A-2b]
[Chemical Formula A-2c]
[Chemical Formula A-2d]
[Chemical Formula A-2e]
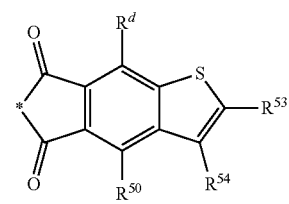
[Chemical Formula A-2f]
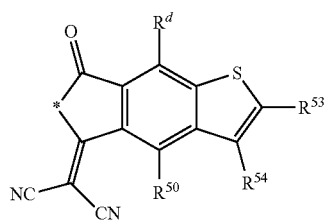
[Chemical Formula A-2g]
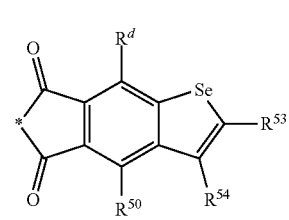
[Chemical Formula A-2h]
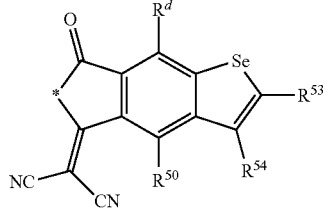
[Chemical Formula A-3a]
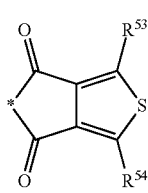
[Chemical Formula A-3b]
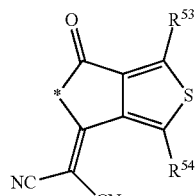
[Chemical Formula A-3c]
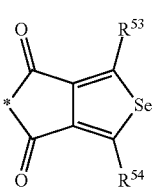

[Chemical Formula A-3d]
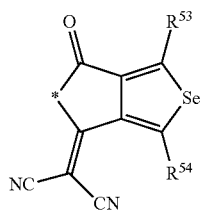

[Chemical Formula A-3e]
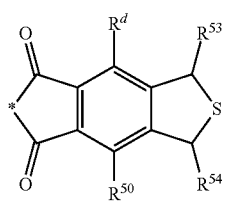

[Chemical Formula A-3f]
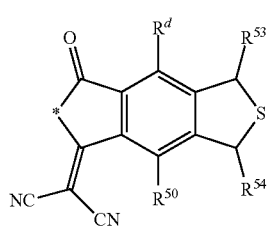

[Chemical Formula A-3g]
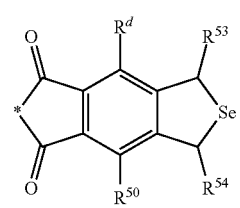

[Chemical Formula A-3h]
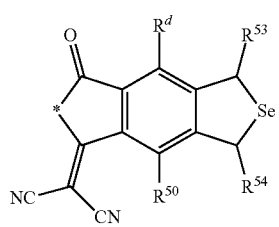

[Chemical Formula A-4a]
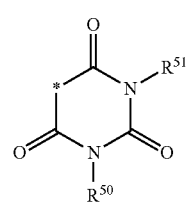

[Chemical Formula A-4b]
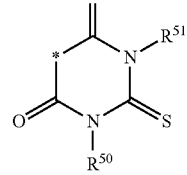

[Chemical Formula A-5a]
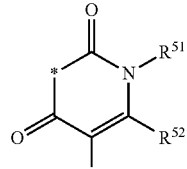

[Chemical Formula A-6a]
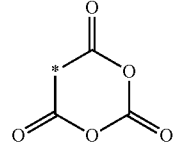

[Chemical Formula A-6b]
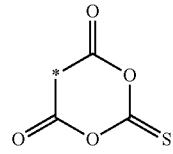

[Chemical Formula A-7a]
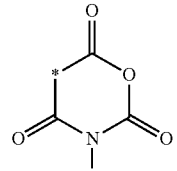

[Chemical Formula A-7b]
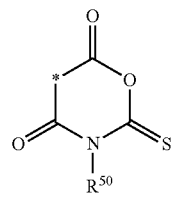

wherein, in Chemical Formulas A-1a to A-7b, $R^{50}$ to $R^{54}$ and $R^d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^{50}$ to $R^{54}$ and $R^d$ are each independently present or two adjacent ones of $R^{50}$ to $R^{54}$ and $R^d$ are linked to each other to form a ring, and

* is a linking point with Chemical Formula 1.

The compound may be represented by one of Chemical Formulas 2 to 7.

[Chemical Formula 2]
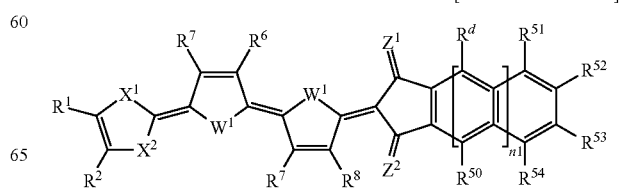

-continued

[Chemical Formula 3]

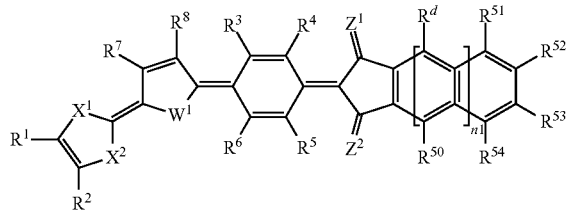

[Chemical Formula 4]

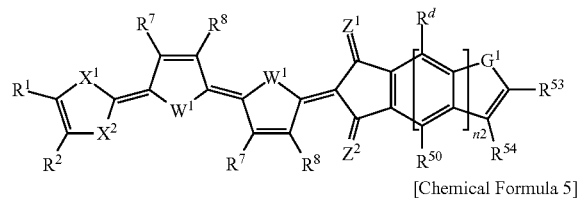

[Chemical Formula 5]

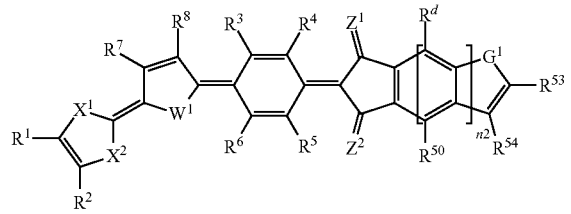

[Chemical Formula 6]

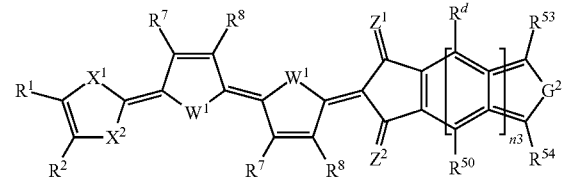

[Chemical Formula 7]

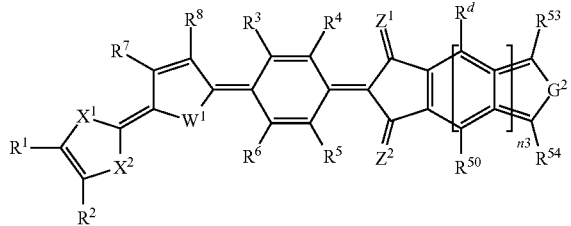

In Chemical Formulas 2 to 7, $X^1$ and $X^2$ are each independently O, S, Se, Te, or $NR^a$, $W^1$, $G^1$, and $G^2$ are each independently O, S, Se, or Te, $Z^1$ and $Z^2$ are each independently O, S, Se, Te, or $CR^bR^c$, wherein $R^b$ and $R^c$ are each independently hydrogen, a substituted or unsubstituted C1 to C30 alkyl group, or a cyano group, $R^1$ to $R^8$, $R^{50}$ to $R^{54}$, and $R^a$, and $R^d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, and n1 to n3 are each independently an integer of 0 to 2.

A peak absorption wavelength of the compound may belong to a wavelength spectrum of about 800 nm to about 3000 nm and a temperature at which a weight loss of the compound of 50% relative to the initial weight of the compound occurs during thermogravimetric analysis of the compound at an ambient pressure of about 0.01 Pa to about 10 Pa is about 300° C. to about 500° C.

According to some example embodiments, a film including the compound is provided.

According to some example embodiments, a sensor includes a first electrode, a second electrode, and an infrared photoelectric conversion layer between the first electrode and the second electrode and including the compound represented by Chemical Formula 1.

A wavelength at a peak external quantum efficiency of the sensor may belong to a wavelength spectrum of about 800 nm to about 3000 nm.

The infrared photoelectric conversion layer may further include a counterpart material that forms a pn junction with the compound.

The first electrode may include a reflective layer and the second electrode may include a semi-transmissive layer.

In some example embodiments, a sensor may include a first electrode, a second electrode, and an infrared photoelectric conversion layer between the first electrode and the second electrode. A peak wavelength of an absorption spectrum of the infrared photoelectric conversion layer may belong to about 800 nm to about 3000 nm. A full width at half maximum (FWHM) of the absorption spectrum of the infrared photoelectric conversion layer may be about 100 nm to about 800 nm. The infrared photoelectric conversion layer may include a compound having a bandgap energy of about 0.5 eV to about 1.5 eV, and a temperature at which a weight loss of the compound of 50% relative to an initial weight of the compound occurs during thermogravimetric analysis of the compound at an ambient pressure of about 0.01 Pa to about 10 Pa is about 300° C. to about 500° C.

The infrared photoelectric conversion layer may further include a counterpart material that forms a pn junction with the compound.

According to some example embodiments, an electronic device including the compound, the film, or the sensor is provided. The compound may exhibit good light absorption characteristics and electrical characteristics in the infrared wavelength spectrum and thus may be effectively applied to a sensor.

DETAILED DESCRIPTION

Figure 1:
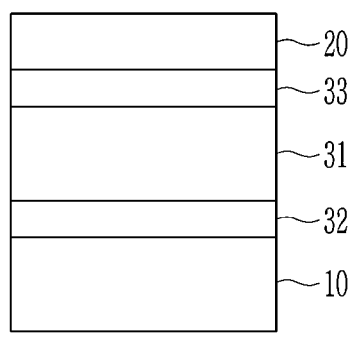
FIG. 1 is a cross-sectional view showing an infrared sensor according to some example embodiments.

Hereinafter, some example embodiments will be described in detail so that those of ordinary skill in the art can easily implement them. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%). It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof. When the terms "about" or "substantially" are used in this specification in connection with a numerical value, it is intended that the associated numerical value include a tolerance of ±10% around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to one including 1 to 4 heteroatoms selected from N, O, S, Se, Te, Si, and P.

As used herein, when a definition is not otherwise provided, "aryl group" refers to a group including at least one hydrocarbon aromatic moiety. All elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group. The aryl group may include a monocyclic, polycyclic or fused polycyclic (i.e., rings sharing adjacent pairs of carbon atoms) functional group.

As used herein, when a definition is not otherwise provided, "heterocycle" or "heterocyclic group" is a higher concept including a "heteroaryl group", and it means inclusion of at least one hetero atom of N, O, S, Se, Te, P, or Si instead of carbon (C) in the ring. When the heterocycle is a fused ring, the heterocycle may have at least one heteroatom, and each ring may have a heteroatom.

Hereinafter, when a definition is not otherwise provided, "ring" or "cyclic group" means an aromatic ring, a non-aromatic ring, a heteroaromatic ring, a hetero non-aromatic ring, a fused ring thereof, and/or any combination thereof. The aromatic ring may be a C6 to C30 aryl group or a C2 to C30 heteroaryl group, and the non-aromatic ring may be a C3 to C30 cycloalkyl group, a C3 to C30 cycloalkenyl group, a C3 to C30 cycloalkynyl group, a C3 to C30 heterocycloalkyl group, a C3 to C30 heterocycloalkenyl group, or a C3 to C30 heterocycloalkynyl group.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a workfunction or an energy level is expressed as an absolute value from a vacuum level. In addition, when the workfunction or the energy level is referred to be deep, high, or large, it may have a large absolute value based on "0 eV" of the vacuum level while when the workfunction or the energy level is referred to be shallow, low, or small, it may have a small absolute value based on "0 eV" of the vacuum level. Further, the differences between the workfunction and/or the energy levels may be values obtained by subtracting a small value of the absolute value from a large value of the absolute value.

Hereinafter, the bandgap energy means an absolute value of a difference between the HOMO energy level and the LUMO energy level, and the wide bandgap energy means that the absolute value of the difference between the HOMO energy level and the LUMO energy level is large.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining a bandgap energy using a UV-Vis spectrometer (Shimadzu Corporation), and then calculating the LUMO energy level from the bandgap energy and the already measured HOMO energy level.

Hereinafter, unless otherwise defined, "metal" includes a metal and a semimetal.

Hereinafter, unless otherwise defined, "combination" includes mixing and/or stacking.

Hereinafter, "maximum absorption wavelength" may be a wavelength exhibiting the highest absorption (absorbance) in the full wavelength region. Hereinafter, "peak absorption wavelength" may be a wavelength corresponding to a peak of each absorption spectrum in one or more absorption spectra. When there are two or more wavelength spectra in the full wavelength region, the "peak absorption wavelength" may be two or more. Hereinafter, "peak external quantum efficiency (EQE) wavelength" may be a wavelength corresponding to a peak of each external quantum efficiency spectrum in one, or two or more external quantum efficiency spectra. "Peak external quantum efficiency (EQE) wavelength" may be two or more if there are two or more external quantum efficiency spectra in the full wavelength region.

Hereinafter, a compound according to some example embodiments is described.

The compound according to some example embodiments may be a light absorbing material, or may be an infrared absorbing material configured to absorb light in an infrared wavelength spectrum. The compound according to some example embodiments may be a light absorbing semiconductor, and may be an infrared photoelectric conversion material configured to absorb light in an infrared wavelength spectrum and convert the absorbed light into an electrical signal.

The compound according to some example embodiments may be represented by Chemical Formula 1, although example embodiments are not limited thereto.

[Chemical Formula 1]

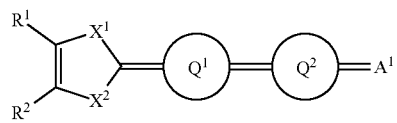

In Chemical Formula 1, $Q^1$ and $Q^2$ are each independently a substituted or unsubstituted C3 to C30 quinoid ring, $X^1$ and $X^2$ are each independently O, S, Se, Te, or $NR^a$, $R^1$, $R^2$, and $R^a$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^1$ and $R^2$ are each independently present or are combined with each other to form a ring, and $A^1$ may be a substituted or unsubstituted C6 to C30 hydrocarbon cyclic group having at least one substituent selected from C=O, C=S, C=Se, C=Te, and $CR^aR^b$, wherein $R^b$ and $R^c$ are each independently hydrogen, a substituted or unsubstituted C1 to C30 alkyl group, or a cyano group; a substituted or unsubstituted C2 to C30 heterocyclic group having at least one substituent selected from C=O, C=S, C=Se, C=Te, and $CR^aR^b$, wherein $R^b$ and $R^c$ are each independently hydrogen, a substituted or unsubstituted C1 to C30 alkyl group, or a cyano group; or a fused ring thereof.

The compound represented by Chemical Formula 1 may form a very large dipole moment by having an asymmetric structure having an electron donating moiety and an electron accepting moiety at both ends, and the length and planarity of the molecule may be effectively controlled by the two quinoid rings between both end groups. Herein, the quinoid ring may be a ring structure derived from oxidation of an aromatic ring, a heteroaromatic ring, or a fused ring thereof. Accordingly, the compound may be configured to effectively absorb light in the infrared wavelength region and exhibit good photoelectric conversion characteristics.

In Chemical Formula 1, the ring including $X^1$ and $X^2$ may be an electron donating moiety, and $X^1$ and $X^2$ may be the same as or different from each other.

For example, at least one of $X^1$ or $X^2$ may be O, S, Se, or Te, and for example, $X^1$ and $X^2$ may each independently be O, S, Se, or Te.

For example, one of $X^1$ or $X^2$ may be S and the other may be O, S, Se, Te, or $NR^a$.

For example, each of $X^1$ and $X^2$ may be S.

For example, at least one of $R^1$ or $R^2$ may be a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof.

For example, at least one of $R^1$ or $R^2$ may be a substituted or unsubstituted C1 to C30 alkyl group, for example, at least one of $R^1$ or $R^2$ may be a substituted or unsubstituted C3 to C30 branched alkyl group.

For example, $R^1$ and $R^2$ may be linked to each other to form a fused ring with a ring including $X^1$ and $X^2$. For example, $R^1$ and $R^2$ may be linked to each other to form benzene, naphthalene, anthracene, or phenanthrene.

For example, $Q^1$ and $Q^2$ of Chemical Formula 1 may each independently include at least one substituted or unsubstituted 5-membered quinoid ring, at least one substituted or unsubstituted 6-membered quinoid ring, or a fused ring thereof. For example, $Q^1$ and $Q^2$ may each independently be one, two, or three substituted or unsubstituted 5-membered quinoid rings; a fused ring of one, two, or three substituted or unsubstituted 5-membered quinoid rings; one, two, or three substituted or unsubstituted 6-membered quinoid rings; a fused ring of one, two, or three substituted or unsubstituted 6-membered quinoid rings; a fused ring of one or two substituted or unsubstituted 5-membered quinoid rings and one or two substituted or unsubstituted 6-membered quinoid rings; or any combination thereof.

For example, $Q^1$ and $Q^2$ may be the same.

For example, $Q^1$ and $Q^2$ may be different from each other.

For example, $Q^1$ and $Q^2$ may each independently be one selected from the groups listed in Group 1 (e.g., may each independently be one group of a plurality of groups listed in Group 1), but are not limited thereto.

[Group 1]

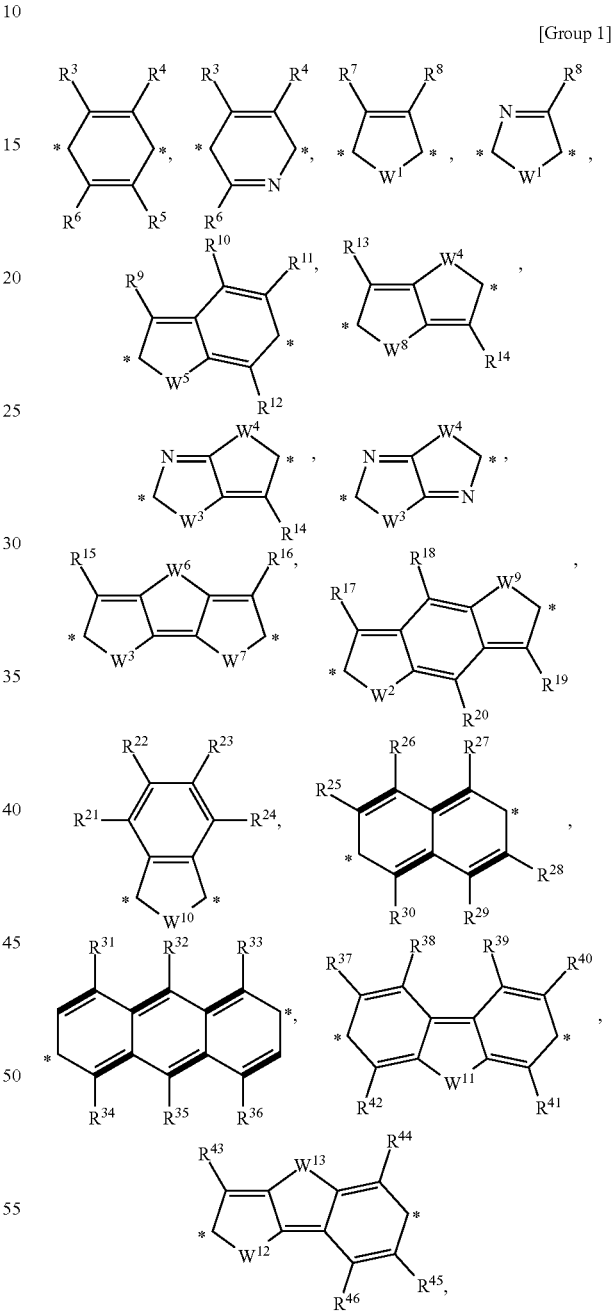

In Group 1, $W^1$ to $W^{13}$ may each independently be O, S, Se, or Te, $R^3$ to $R^{46}$ may each independently be hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^3$ to $R^{46}$ may each independently be present or two adjacent ones of $R^3$ to $R^{46}$ may be linked to each other to form a ring, and \* is a linking point with Chemical Formula 1.

For example, at least one of $R^3$ to $R^{46}$ may be a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof.

For example, at least one of $R^3$ to $R^{46}$ may be a substituted or unsubstituted C1 to C30 alkyl group, for example a substituted or unsubstituted C3 to C30 linear alkyl group or a substituted or unsubstituted C3 to C30 branched alkyl group.

In Chemical Formula 1, $A^1$ may be an electron accepting moiety, for example, a cyclic group represented by Chemical Formula A.

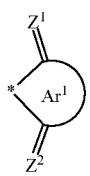

[Chemical Formula A]

In Chemical Formula A, $Ar^1$ may be a substituted or unsubstituted C6 to C30 aryl group, a substituted or unsubstituted C3 to C30 heteroaryl group, or a fused ring thereof, $Z^1$ and $Z^2$ may each independently be O, S, Se, Te, or $CR^bR^c$, wherein $R^b$ and $R^c$ may each independently be hydrogen, a substituted or unsubstituted C1 to C30 alkyl group, or a cyano group, and \* is a linking point with Chemical Formula 1.

For example, $Ar^1$ may be at least one pentagonal ring; at least one hexagonal ring; a fused ring of at least one pentagonal ring and at least one hexagonal ring.

Herein, the pentagonal ring may be a pentagonal hydrocarbon ring, a pentagonal heterocycle, or any combination thereof, and the hexagonal ring may be a hexagonal hydrocarbon ring, a hexagonal heterocycle, or any combination thereof.

For example, $Z^1$ and $Z^2$ may be the same as or different from each other, for example, at least one of $Z^1$ or $Z^2$ may be O.

For example, $Z^1$ and $Z^2$ may be the same as each other, and for example, $Z^1$ and $Z^2$ may each be O.

For example, $Z^1$ and $Z^2$ may be different from each other, and for example, one of $Z^1$ or $Z^2$ may be O and the other may be S, Se, Te, $C(CN)R^b$, wherein $R^b$ is hydrogen, a substituted or unsubstituted C1 to C30 alkyl group, or $C(CN)_2$.

As an example, $Ar^1$ may be represented by one of Chemical Formulas A-1 to A-7, but is not limited thereto.

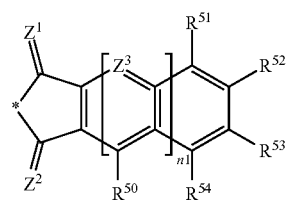

[Chemical Formula A-1]

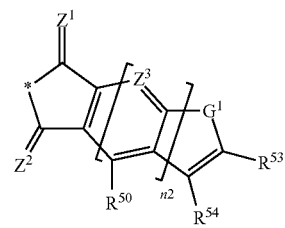

[Chemical Formula A-2]

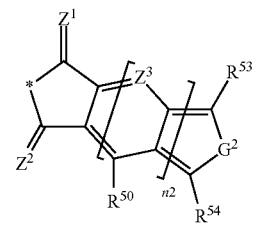

[Chemical Formula A-3]

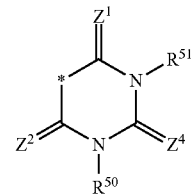

[Chemical Formula A-4]

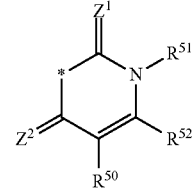

[Chemical Formula A-5]

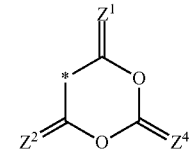

[Chemical Formula A-6]

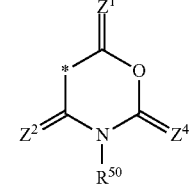

[Chemical Formula A-7]

In Chemical Formulas A-1 to A-7, $Z^1$, $Z^2$, and $Z^4$ may each independently be O, S, Se, Te, or $CR^bR^c$, wherein $R^b$ and $R^c$ may each independently be hydrogen, a substituted or unsubstituted C1 to C30 alkyl group, or a cyano group, $Z^3$ may be N or $CR^d$, $G^1$ and $G^2$ may each independently be O, S, Se, or Te, $R^{50}$ to $R^{54}$ and $R^d$ may each independently be hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^{50}$ to $R^{54}$ and $R^d$ may each independently be present or two adjacent ones of $R^{50}$ to $R^{54}$ and $R^d$ may be linked to each other to form a ring, n1 to n3 may each independently be an integer of 0 to 2 (e.g., 0, 1, or 2), and

* may be a linking point with Chemical Formula 1.

For example, at least one of $R^{50}$ to $R^{54}$ or $R^d$ may be a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof.

For example, at least one of $R^{50}$ to $R^{54}$ or $R^d$ may be a substituted or unsubstituted C1 to C30 alkyl group, a halogen, a cyano group, or any combination thereof, and may be, for example, a substituted or unsubstituted C3 to C30 linear alkyl group, a substituted or unsubstituted C3 to C30 branched alkyl group, F, Cl, Br, I, a cyano group, or any combination thereof.

For example, $Ar^1$ may be represented by one of Chemical Formulas A-1a to A-7b, but is not limited thereto.

[Chemical Formula A-1a]

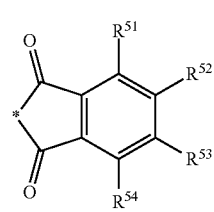

[Chemical Formula A-1b]

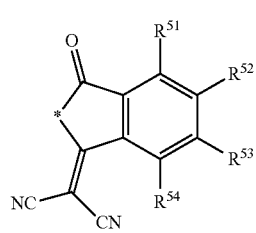

[Chemical Formula A-1c]

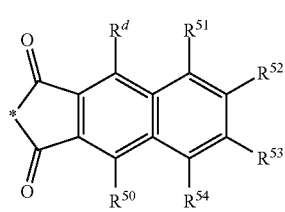

[Chemical Formula A-1d]

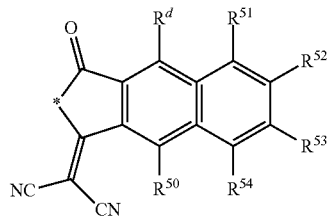

[Chemical Formula A-2a]

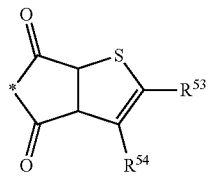

[Chemical Formula A-2b]

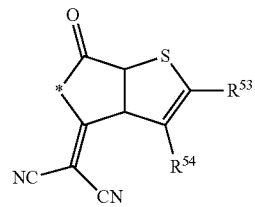

[Chemical Formula A-2c]

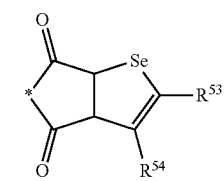

[Chemical Formula A-2d]

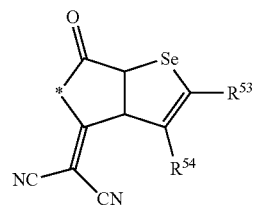

[Chemical Formula A-2e]

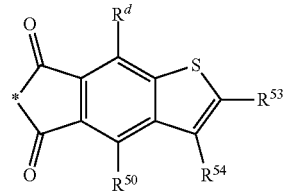

[Chemical Formula A-2f]

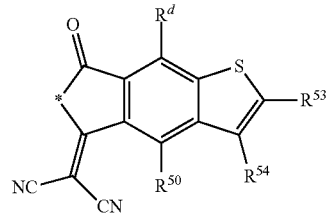

[Chemical Formula A-2g]
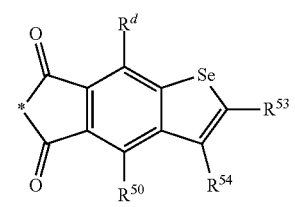
[Chemical Formula A-2h]
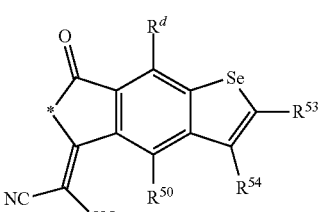
[Chemical Formula A-3a]
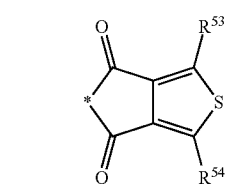
[Chemical Formula A-3b]
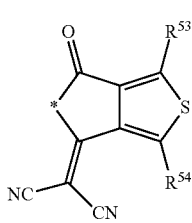
[Chemical Formula A-3c]
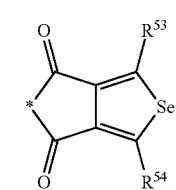
[Chemical Formula A-3d]
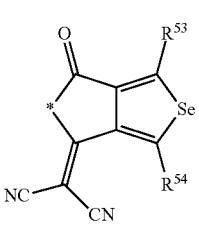
[Chemical Formula A-3e]
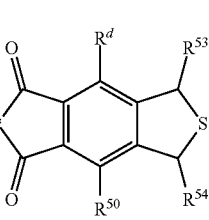
[Chemical Formula A-3f]
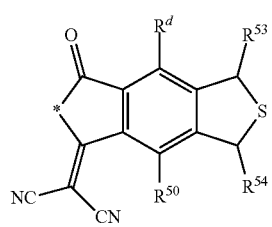
[Chemical Formula A-3g]
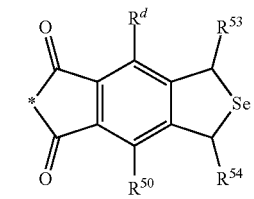
[Chemical Formula A-3h]
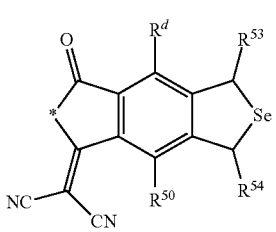
[Chemical Formula A-4a]
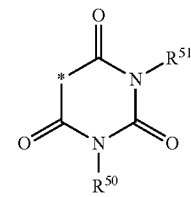
[Chemical Formula A-4b]
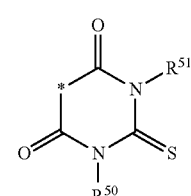
[Chemical Formula A-5a]
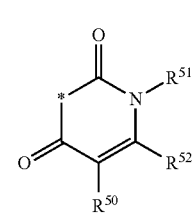
[Chemical Formula A-6a]
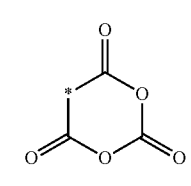
[Chemical Formula A-6b]
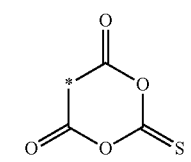

-continued

[Chemical Formula A-7a]

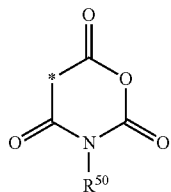

[Chemical Formula A-7b]

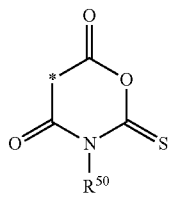

In Chemical Formulas A-1a to A-7b, $R^{50}$ to $R^{54}$ and $R^d$ are the same as $R^{50}$ to $R^{54}$ and $R^d$ described above. For example, $R^{50}$ to $R^{54}$ and $R^d$ may each independently be hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof.

For example, the compound may be represented by one of Chemical Formulas 2 to 7, but is not limited thereto.

[Chemical Formula 2]

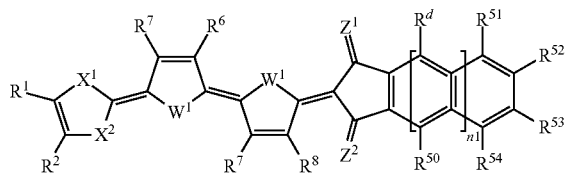

[Chemical Formula 3]

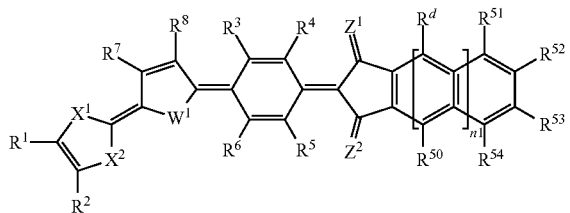

[Chemical Formula 4]

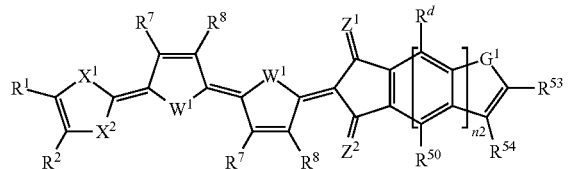

[Chemical Formula 5]

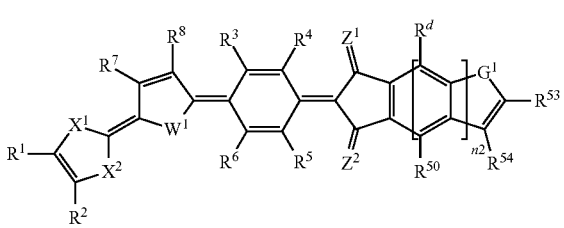

[Chemical Formula 6]

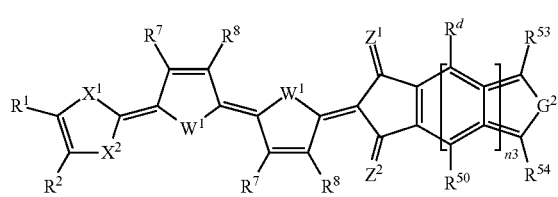

[Chemical Formula 7]

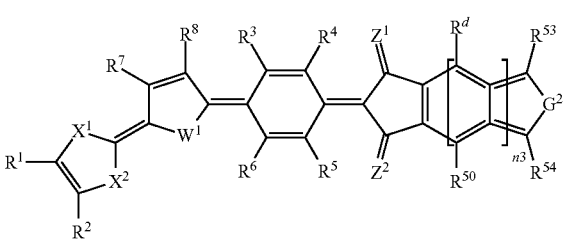

In Chemical Formulas 2 to 7, $X^1$, $X^2$, $W^1$, $G^1$, $G^2$, $Z^1$, $Z^2$, $R^1$ to $R^8$, $R^{50}$ to $R^{54}$, $R^a$, $R^d$, and n1 to n3 are the same as described above. For example, in Chemical Formulas 2 to 7, $X^1$ and $X^2$ may each independently be O, S, Se, Te, or $NR^a$, $W^1$, $G^1$, and $G^2$ may each independently be O, S, Se, or Te, $Z^1$ and $Z^2$ may each independently be O, S, Se, Te, or $CR^bR^c$, wherein $R^b$ and $R^c$ are each independently hydrogen, a substituted or unsubstituted C1 to C30 alkyl group, or a cyano group, $R^1$ to $R^8$, $R^{50}$ to $R^{54}$, $R^a$, and $R^d$ may each independently be hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, and n1 to n3 may each independently be an integer of 0 to 2.

The main absorption spectrum of the aforementioned compound may be in an infrared wavelength region (also referred to herein as an infrared wavelength spectrum), and thus, the aforementioned compound may be an infrared absorbing material. Herein, the infrared wavelength region may be, for example, greater than or equal to about 750 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 850 nm, greater than or equal to about 870 nm, greater than or equal to about 890 nm, greater than or equal to about 900 nm, greater than or equal to about 920 nm, greater than or equal to about 940 nm, greater than or equal to about 960 nm, greater than or equal to about 980 nm, greater than or equal to about 1000 nm, greater than or equal to about 1050 nm, or greater than or equal to about 1100 nm, and may be less than or equal to about 3000 nm, less than or equal to about 2500 nm, less than or equal to about 2200 nm, less than or equal to about 2100 nm, or less than or equal to about 2000 nm. For example, the peak absorption wavelength of the compound may belong to a wavelength region of about 750 nm to about 3000 nm, within the above range, for example about 800 nm to about 3000 nm, for example about 750 nm to about 2500 nm, for example about 780 nm to about 2200 nm, for example about 790 nm to about 2100 nm, for example about 800 nm to about 2000 nm, for example about 810 nm to about 2000 nm, for example about 820 nm to about 2000 nm, for example about 830 nm to about 2000 nm, for example about 850 nm to about 2000 nm, for example about 870 nm to about 2000 nm, for example about 890 nm to about 2000 nm, for example about 900 nm to about 2000 nm, for example about 920 nm to about 2000 nm, for example about 940 nm to about 2000 nm, for example about 960 nm to about 2000 nm, for example about 980 nm to about 2000 nm, for example about 1000 nm to about 2000 nm, for example about 1050 nm to about 2000 nm, or for example about 1100 nm to about 2000 nm.

The absorption spectrum in the solution state and the thin film state of the compound may belong to about 750 nm to about 1500 nm, respectively, and within the above range, about 750 nm to about 1300 nm, about 750 nm to about 1200 nm, about 750 nm to about 1100 nm, about 750 nm to about 1000 nm, about 780 nm to about 1500 nm, about 780 nm to about 1300 nm, about 780 nm to about 1200 nm, about 780 nm to about 1100 nm, about 780 nm to about 1000 nm, about 800 nm to about 1500 nm, about 800 nm to about 1300 nm, about 800 nm to about 1200 nm, about 800 nm to about 1100 nm, about 800 nm to about 1000 nm, about 810 nm to about 1500 nm, about 810 nm to about 1300 nm, about 810 nm to about 1200 nm, about 810 nm to about 1100 nm, about 810 nm to about 1000 nm, about 820 nm to about 1500 nm, about 820 nm to about 1300 nm, about 820 nm to about 1200 nm, about 820 nm to about 1100 nm, about 820 nm to about 1000 nm, about 830 nm to about 1500 nm, about 830 nm to about 1300 nm, about 830 nm to about 1200 nm, about 830 nm to about 1100 nm, about 830 nm to about 1000 nm, about 840 nm to about 1500 nm, about 840 nm to about 1300 nm, about 840 nm to about 1200 nm, about 840 nm to about 1100 nm, about 840 nm to about 1000 nm, about 850 nm to about 1500 nm, about 850 nm to about 1300 nm, about 850 nm to about 1200 nm, about 850 nm to about 1100 nm, or about 850 nm to about 1000 nm. Herein, the solution for measuring the absorption spectrum may be prepared by dissolving the compound in a solvent that can dissolve the compound and does not affect the light absorption characteristics. The solvent may be selected from, for example, dimethyl sulfoxide (DMSO), toluene, chloroform, or any combination thereof, and a concentration thereof may be, for example, about $1 \times 10^{-5}$ M to about $5 \times 10^{-5}$ M, but is not limited thereto.

The absorption spectrum in the thin film state of the compound may be located at a longer wavelength than the absorption spectrum in the solution state of the compound. For example, the absorption spectrum in the thin film state of the compound may be located at a longer wavelength than the absorption spectrum in the solution state of the compound by about 30 nm to about 700 nm, about 50 nm to about 700 nm, 100 nm to about 700 nm, 150 nm to about 700 nm, about 200 nm to about 700 nm, about 250 nm to about 700 nm, about 300 nm to about 700 nm, about 100 nm to about 500 nm, about 150 nm to about 500 nm, about 200 nm to about 500 nm, about 250 nm to about 500 nm, or about 300 nm to about 500 nm.

The aforementioned compound may exhibit good photoelectric conversion characteristics, and thus may be effectively used as a photoelectric conversion material of an infrared sensor. For example, a bandgap energy of the compound may be, for example, about 0.5 eV to about 1.5 eV, and within the above range and about 0.6 eV to about 1.4 eV, about 0.7 eV to about 1.3 eV, or about 0.8 eV to about 1.2 eV. For example, the HOMO energy level of the compound may be, for example, about 4.0 eV to about 5.5 eV, and within the above range, about 4.2 eV to about 5.3 eV, about 4.4 eV to about 5.1 eV, or about 4.5 eV to about 5.0 eV.

On the other hand, the aforementioned compound has good heat resistance, so that thermal decomposition may be prevented or reduced during deposition, and thus it may be repeatedly deposited. The compound may be deposited by thermal evaporation or vacuum deposition, for example by sublimation. For example, deposition by sublimation may be confirmed by thermogravimetric analysis (TGA), and at a thermogravimetric analysis (e.g., a thermogravimetric analysis of the compound) under a pressure (e.g., an ambient pressure of the environment in which the compound is located) of less than or equal to about 10 Pa (e.g., about 0.01 Pa to about 10 Pa, about 0.1 Pa to about 10 Pa, about 1 Pa to about 10 Pa, or the like), a temperature at which a 10% weight loss relative to an initial weight (e.g., a temperature at which the compound experiences 10% weight loss relative to an initial weight of the compound) may be less than or equal to about 450° C. and a temperature at which a 50% weight loss relative to an initial weight (e.g., a temperature at which the compound experiences 50% weight loss relative to an initial weight of the compound) may be less than or equal to about 500° C. For example, at a thermogravimetric analysis under a pressure of less than or equal to about 10 Pa, a temperature at which a 10% weight loss relative to an initial weight of the compound may be for example about 230° C. to about 450° C. and a temperature at which a 50% weight loss relative to an initial weight may be about 300° C. to about 500° C.

The aforementioned compound may be deposited to be prepared in the form of a film. The film, which may comprise the aforementioned compound, may have a greatly larger dimension in an in-plane direction (e.g., xy direction) of the film, that is, a width and a length, than a dimension in a depth direction (e.g., z direction) of the film, that is, a thickness of the film. For example, the thickness of the film may be about 1 nm to about 100 μm, about 1 nm to about 80 μm, about 1 nm to about 50 μm, about 1 nm to about 40 μm, about 1 nm to about 30 μm, about 1 nm to about 20 μm, or about 1 nm to about 10 μm.

The film may be applied to various fields requiring light absorption properties of an infrared wavelength region, for example, an infrared-absorbing/blocking film.

The compound has simultaneously light absorption properties and photoelectric characteristics of the infrared wavelength region and may be effectively used as a photoelectric conversion material of an infrared sensor. An infrared sensor including a photoelectric conversion device that further includes the aforementioned compound as a photoelectric conversion material of a photoelectric conversion layer of the photoelectric conversion device may have improved sensitivity to incident light in the infrared wavelength region, for example in low-illumination conditions and thus may have improved sensitivity and light sensing performance.

While example embodiments of the compound may be represented by Chemical Formula 1, example embodiments are not limited thereto.

The infrared sensor may be configured to sense at least a portion of light in the infrared wavelength region, for example, may be configured to selectively absorb light of at least a portion of the infrared wavelength region and thus convert the absorbed light into electrical signals. The infrared sensor may exhibit an absorption spectrum having a peak absorption wavelength in the infrared wavelength region, and the infrared wavelength region is the same as described above. Each infrared sensor may independently include a photo-sensing device such as a photodiode or a photoelectric conversion device, and may be, for example, a photoelectric conversion device.

FIG. 1 is a cross-sectional view showing an infrared sensor according to some example embodiments.

Referring to FIG. 1, an infrared sensor 100 according to some example embodiments may be an infrared photoelectric conversion device, and includes a first electrode 10 and a second electrode 20 facing each other, an infrared photoelectric conversion layer 31 between the first electrode 10 and the second electrode 20; and optionally buffer layers 32 and 33 (which may be omitted in some example embodiments).

A substrate (not shown) may be disposed under the first electrode 10 or on (e.g., above) the second electrode 20. The substrate may be for example made of an inorganic material such as glass; an organic material such as polycarbonate, polymethylmethacrylate, polyethyleneterephthalate, polyethylenenaphthalate, polyamide, polyethersulfone, or any combination thereof; or a silicon wafer. The substrate may be a semiconductor substrate. The substrate may be omitted.

One of the first electrode 10 or the second electrode 20 is an anode and the other is a cathode. For example, the first electrode 10 may be an anode and the second electrode 20 may be a cathode. For example, the first electrode 10 may be a cathode and the second electrode 20 may be an anode.

At least one of the first electrode 10 or the second electrode 20 may be a light-transmitting electrode. The light-transmitting electrode may be a transparent electrode or a semi-transmissive electrode. The transparent electrode may have a light transmittance of greater than or equal to about 85%, greater than or equal to about 90%, or greater than or equal to about 95% and the semi-transmissive electrode may have a light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more selected from indium tin oxide (ITO), indium zinc oxide (IZO), zinc oxide (ZnO), tin oxide (SnO), aluminum tin oxide (AlTO), and fluorine-doped tin oxide (FTO), the carbon conductor may include one or more selected from graphene and carbon nanostructures, and the metal thin film may be a very thin film including silver (Ag), copper (Cu), aluminum (Al), magnesium (Mg), magnesium-silver (Mg—Ag), magnesium-aluminum (Mg—Al), an alloy thereof, or any combination thereof.

For example, each of the first electrode 10 and the second electrode 20 may be light-transmitting electrode. For example, the second electrode 20 may be a light receiving electrode disposed at a light receiving side.

For example, one of the first electrode 10 or the second electrode 20 may be a light-transmitting electrode and the other may be a reflective electrode. The reflective electrode may include a reflective layer including an optically opaque material, and the reflective layer may have a light transmittance of less than about 10%, less than about 8%, less than or equal to about 7%, less than or equal to about 5%, less than or equal to about 3%, or less than or equal to about 1%, equal to or greater than 0%, equal to or greater than about 0.1%, greater than or equal to about 0.5%, for example between about 0.1% to about 10%, for example between about 0.1% to about 8%, for example between about 0.1% to about 7%, for example between about 0.1% to about 5%, for example between about 0.1% to about 5%, for example between about 0.1% to about 3%, for example between about 0.1% to about 1%, and may have, for example, a reflectance of greater than or equal to about 10%, greater than or equal to about 20%, greater than or equal to about 30%, greater than or equal to about 50%, or greater than or equal to about 70%, less than or equal to 100%, less than or equal to about 99.9%, less than or equal to about 99%, for example between about 10% and 100%, for example between about 20% and 100%, for example between about 30% and 100%, for example between about 30% and 100%, for example between about 50% and 100%, for example between about 70% and 100%. The optically opaque material may include a metal, a metal nitride, or any combination thereof, and may be for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective layer may be one layer or two or more layers.

The infrared photoelectric conversion layer 31 may be a layer for photoelectric conversion by absorbing light in an infrared wavelength region (e.g., a layer configured to photoelectrically convert incident light in the infrared wavelength region), and may include the aforementioned compound. The infrared photoelectric conversion layer 31 may include a p-type semiconductor and an n-type semiconductor which collectively form a pn junction, may receive light from the outside (e.g., incident light) to generate excitons, and then may separate the generated excitons into holes and electrons.

The p-type semiconductor and/or the n-type semiconductor may be a light absorbing material configured to absorb light (e.g., incident light) in at least a partial wavelength region. For example, the aforementioned compound may be used as a p-type semiconductor or an n-type semiconductor, such that the infrared photoelectric conversion layer 31 may include the aforementioned compound as a p-type semiconductor or an n-type semiconductor, and the infrared photoelectric conversion layer 31 may further include a counterpart material forming a pn junction with the aforementioned compound, although example embodiments are not limited thereto and in some example embodiments the infrared photoelectric conversion layer 31 may include the aforementioned compound without any counterpart material. The counterpart material may be, for example, a light absorbing material (e.g., a material configured to absorb light (e.g., incident light) in at least a partial wavelength region) or a non-light absorbing material (e.g., a material configured to not absorb light (e.g., incident light) in any wavelength region), and may be, for example, an organic material, an inorganic material, an organic-inorganic material, or any combination thereof. For example, the aforementioned compound may be used as a p-type semiconductor, and the infrared photoelectric conversion layer 31 may further include a counterpart material that includes an n-type semiconductor that forms a pn junction with the aforementioned compound. The counterpart material may include an n-type semiconductor that may include fullerene or a fullerene derivative. In another example, the aforementioned compound may be used as an n-type semiconductor, and the infrared photoelectric conversion layer 31 may further include a counterpart material that includes a p-type semiconductor that forms a pn junction with the aforementioned compound. The counterpart material may include a p-type semiconductor that may include a quantum dot, a quinoid metal complex, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, a squaraine compound, a boron-dipyrromethene compound, a nickel-dithiol complex, merocyanine, a diketopyrrolopyrrole, a croconium compound, a derivative thereof, or any combination thereof, but is not limited thereto. For example, the aforementioned compound may be used as an n-type semiconductor, and the infrared photoelectric conversion layer 31 may further include a p-type semiconductor that forms a pn junction with the aforementioned compound.

In some example embodiments, different example embodiments of the aforementioned compound represented by Chemical Formula 1 may be used as p-type and n-type semiconductors in a same infrared photoelectric conversion layer 31 to form a pn junction in the same infrared photoelectric conversion layer 31.

For example, the infrared photoelectric conversion layer 31 may include an intrinsic layer (layer 1) in which the aforementioned compound and a counterpart material are co-deposited. The intrinsic layer may be a blended layer in which the aforementioned compound and counterpart material are blended in a bulk heterojunction form.

For example, the aforementioned compound and the counterpart material in the intrinsic layer may be included in a particular (or, alternatively, predetermined) composition ratio, wherein the composition ratio may be defined as the volume or thickness of the aforementioned compound relative to the volume or thickness of the counterpart material. For example, a composition ratio of the aforementioned compound and the counterpart material in the infrared photoelectric conversion layer 31 may be about 0.1:1 to about 10:1, within the above range about 0.2:1 to about 8:1, about 0.5:1 to about 5:1, about 0.8:1 to about 2:1, or about 1:1.

For example, the aforementioned compound may be included in the intrinsic layer in an amount that is less than or equal to an amount of the counterpart material in the intrinsic layer. For example, the composition ratio of the aforementioned compound to the counterpart material in the intrinsic layer may be about 0.10 to about 1.00, within the above range, about 0.20 to about 1.00, about 0.30 to about 1.00, about 0.40 to about 1.00, about 0.50 to about 1.00, about 0.10 to about 0.80, about 0.20 to about 0.80, about 0.30 to about 0.80, about 0.40 to about 0.80, 0.50 to about 0.80, about 0.10 to about 0.50, about 0.20 to about 0.50, about 0.30 to about 0.50, or about 0.40 to about 0.50.

The infrared photoelectric conversion layer 31 may further include a p-type layer and/or an n-type layer in addition to the intrinsic layer. The p-type layer may include the aforementioned p-type semiconductor and the n-type layer may include the aforementioned n-type semiconductor. For example, the infrared photoelectric conversion layer 31 may include various combinations of p-type layer/I layer, I layer/n-type layer, p-type layer/I layer/n-type layer, and the like.

The main absorption spectrum (e.g., absorption spectrum) of the infrared photoelectric conversion layer 31 may be in the infrared wavelength region, for example greater than or equal to about 800 nm, greater than or equal to about 810 nm, greater than or equal to about 820 nm, greater than or equal to about 830 nm, greater than or equal to about 850 nm, greater than or equal to about 870 nm, greater than or equal to about 890 nm, greater than or equal to about 900 nm, greater than or equal to about 920 nm, greater than or equal to about 940 nm, greater than or equal to about 960 nm, greater than or equal to about 980 nm, greater than or equal to about 1000 nm, greater than or equal to about 1050 nm, or greater than or equal to about 110 nm, and may be less than or equal to about 3000 nm, less than or equal to about 2500 nm, less than or equal to about 2200 nm, less than or equal to about 2100 nm, or less than or equal to about 2000 nm. For example, the peak absorption wavelength of the infrared photoelectric conversion layer 31 may belong to a wavelength region of about 800 nm to about 3000 nm, and within the above range, for example, about 810 nm to about 2500 nm, for example about 820 nm to about 2200 nm, for example about 830 nm to about 2100 nm, for example about 840 nm to about 2000 nm, for example about 850 nm to about 2000 nm, for example about 860 nm to about 2000 nm, for example about 870 nm to about 2000 nm, for example about 880 nm to about 2000 nm, for example about 890 nm to about 2000 nm, for example about 900 nm to about 2000 nm, for example about 920 nm to about 2000 nm, for example about 940 nm to about 2000 nm, for example about 960 nm to about 2000 nm, for example about 980 nm to about 2000 nm, for example about 990 nm to about 2000 nm, for example about 1000 nm to about 2000 nm, for example about 1050 nm to about 2000 nm, or for example about 1100 nm to about 2000 nm.

The light absorption characteristics of the infrared photoelectric conversion layer 31 may be exhibited by a combination of the light absorption characteristics of the aforementioned compound and the light absorption characteristics of the counterpart material. Accordingly, an absorption spectrum of the infrared photoelectric conversion layer 31 may include an absorption wavelength region of the aforementioned compound, but may appear in a wider wavelength region than the absorption spectrum of the aforementioned compound alone. A peak wavelength ($\lambda_{peak,A}$) of the absorption spectrum of the infrared photoelectric conversion layer 31 may belong to about 750 nm to about 1100 nm, and within the above range about 750 nm to about 1050 nm, about 750 nm to about 1000 nm, about 750 nm to about 950 nm, or about 750 nm to about 900 nm. A peak wavelength ($\lambda_{peak,A}$) of the absorption spectrum of the infrared photoelectric conversion layer 31 may belong to about 800 nm to about 1100 nm, and within the above range about 800 nm to about 1050 nm, about 800 nm to about 1000 nm, about 800 nm to about 950 nm, or about 800 nm to about 900 nm. A full width at half maximum (FWHM) of the absorption spectrum of the infrared photoelectric conversion layer 31 may be, for example, greater than or equal to about 100 nm, and within the above range, about 100 nm to about 800 nm, about 150 nm to about 800 nm, about 200 nm to about 800 nm, about 250 nm to about 800 nm, or about 300 nm to about 800 nm. Herein, a full width at half maximum of the absorption spectrum may be a width of the wavelength corresponding to half of the absorption peak.

A thickness of the infrared photoelectric conversion layer 31 may be about 30 nm to about 500 nm, and within the above range about 50 nm to about 400 nm, or about 80 nm to about 300 nm.

The buffer layers 32 and 33 are respectively disposed between the first electrode 10 and the infrared photoelectric conversion layer 31 and/or between the second electrode 20 and the infrared photoelectric conversion layer 31.

For example, the buffer layers 32 and 33 may be charge auxiliary layers, and may facilitate movement of holes and electrons separated from the infrared photoelectric conversion layer 31 to increase efficiency. The buffer layers 32 and 33 may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

For example, the buffer layers 32 and 33 may be light absorption auxiliary layers, and may be disposed on and/or under the infrared photoelectric conversion layer 31 to increase an amount of light absorbed by the infrared photoelectric conversion layer 31, thereby improving light absorption characteristics. For example, at least one of the buffer layer 32 or the buffer layer 33 may include fullerene or a fullerene derivative.

The buffer layers 32 and 33 may include, for example, an organic material, an inorganic material, or an organic-inorganic material.

For example, at least one of the buffer layer 32 or the buffer layer 33 may include a low molecular weight compound, for example, the aforementioned compound.

For example, at least one of the buffer layer 32 or the buffer layer 33 may include a low molecular weight compound, for example, a carbazole-containing compound.

For example, at least one of the buffer layer 32 or the buffer layer 33 may include a polymer.

For example, at least one of the buffer layer 32 or the buffer layer 33 may include an inorganic material, for example, a lanthanide element such as ytterbium (Yb); calcium (Ca); potassium (K); barium (Ba); magnesium (Mg); lithium fluoride (LiF); or an alloy thereof.

For example, at least one of the buffer layer 32 or the buffer layer 33 may include fullerene or a fullerene derivative.

For example, at least one of the buffer layer 32 or the buffer layer 33 may include an inorganic material, for example, a metal oxide such as molybdenum oxide, tungsten oxide, or nickel oxide.

Each thickness of the buffer layers 32 and 33 may each independently be about 1 nm to about 200 nm, and within the above range, about 5 nm to about 200 nm, about 5 nm to about 180 nm, or about 5 nm to about 150 nm.

At least one of the buffer layer 32 or the buffer layer 33 may be omitted from the infrared sensor 100.

The infrared sensor 100 may further include an anti-reflection layer (not shown) under the first electrode 10 or on (e.g., above) the second electrode 20. The anti-reflection layer is disposed at a light incidence side and may lower reflectance of light of incident light and thereby light absorbance may be further improved. For example, when light enters the infrared sensor 100 from (e.g., via) the first electrode 10, the anti-reflection layer may be disposed under (e.g., beneath) the first electrode 10, while when light enters the infrared sensor 100 from (e.g., via) the second electrode 20, the anti-reflection layer may be disposed on (e.g., above) the second electrode 20. The anti-reflection layer may include, for example a material having a refractive index of about 1.6 to about 2.5 and may include for example at least one of a metal oxide, a metal sulfide, or an organic material having a refractive index within the above ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or any combination thereof; a metal sulfide such as zinc sulfide; or an organic material such as an amine derivative, but is not limited thereto.

The infrared sensor 100 may further include an encapsulation film (not shown) on one surface of the first electrode 10 or the second electrode 20. The encapsulation film may include an organic material, an inorganic material, an organic-inorganic material, or any combination thereof, and may have one layer or two or more layers.

The infrared sensor 100 may further include an optical auxiliary layer (not shown) on one surface of the first electrode 10 or the second electrode 20. The optical auxiliary layer may be configured to selectively transmit light in a particular (or, alternatively, predetermined) wavelength region among incident light and may be configured to reflect and/or absorb light in a wavelength region other than that. That is, the optical auxiliary layer may be a selective light transmission layer, for example, may be a semi-transmissive layer.

The optical auxiliary layer may include, for example, a first optical auxiliary layer and a second optical auxiliary layer having different refractive indices. The first optical auxiliary layer may be for example a high refractive index layer and the second optical auxiliary layer may be for example a low refractive index layer. The refractive index (@800 nm to about 1200 nm) of the high refractive index layer may be, for example, greater than or equal to about 1.55 or about 1.55 to about 1.90, and the refractive index (@800 nm to about 1200 nm) of the low refractive index layer may be, for example, less than about 1.55 or greater than or equal to about 1.20 and less than about 1.55. For example, the first optical functional layer may be an aluminum oxide, an organic buffer material, an inorganic buffer material, or any combination thereof, and the second optical functional layer may be a silicon oxide, a silicon nitride, a silicon oxynitride, or any combination thereof, but are limited thereto.

In the infrared sensor 100, when light is incident through the first electrode 10 or the second electrode 20 and the infrared photoelectric conversion layer 31 may be configured to absorb light in the infrared wavelength region, excitons may be generated therein. The generated excitons are separated into holes and electrons in the infrared photoelectric conversion layer 31. The separated holes may move towards the anode which is one of the first electrode 10 or the second electrode 20, and the separated electrons may move towards the cathode which is the other of the first electrode 10 or the second electrode 20, and thus an electrical signal may be obtained.

Hereinafter, various examples of electrodes in the infrared sensor of FIG. 1 are described with reference to FIGS. 2 and 3.

Figure 2:
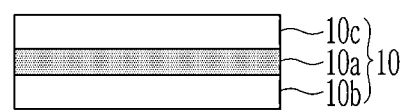
FIG. 2 is a cross-sectional view showing a first electrode of the infrared sensor of FIG. 1 according to some example embodiments.
Figure 3:
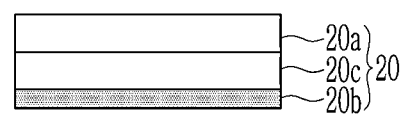
FIG. 3 is a cross-sectional view showing a second electrode of the infrared sensor of FIG. 1 according to some example embodiments.

FIG. 2 is a cross-sectional view showing a first electrode of the infrared sensor of FIG. 1 according to some example embodiments, and FIG. 3 is a cross-sectional view showing a second electrode of the infrared sensor of FIG. 1 according to some example embodiments.

Referring to FIG. 2, the first electrode 10 of the infrared sensor 100 according to some example embodiments includes a plurality of layers, for example, a reflective layer 10a, a lower auxiliary layer 10b, and an upper auxiliary layer 10c, unlike some example embodiments.

The reflective layer 10a may have a high reflectance and a low light transmittance, and may have for example a reflectance of about 10% to about 100%, about 20% to about 100%, about 30% to about 100%, about 50% to about 100%, about 70% to about 100%, about 80% to about 100%, about 90% to about 100%, about 95% to about 100%, about 98% to about 100%, or about 99% to about 100% and a light transmittance of greater than or equal to about 0% and less than about 10%, about 0% to about 8%, about 0% to about 7%, about 0% to about 5%, about 0% to about 3%, or about 0% to about 1%. The reflective layer 10a may include an optically opaque material, a metal, a metal nitride, or any combination thereof, for example, for example, silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective layer 10a may be one layer or two or more layers.

At least one of the lower auxiliary layer 10b or the upper auxiliary layer 10c may be a light-transmitting auxiliary layer, and the light-transmitting auxiliary layer may have, for example, a relatively high light transmittance of about 80% to about 100%, about 85% to about 100%, about 88% to about 100%, or about 90% to about 100%. The light-transmitting auxiliary layer may include an optically transparent conductor, for example, may include at least one of an oxide conductor, a carbon conductor, or a metal thin film. The oxide conductor may include, for example, at least one of indium tin oxide (ITO), indium zinc oxide (IZO), zinc tin oxide (ZTO), aluminum tin oxide (ATO), or aluminum zinc oxide (AZO), the carbon conductor may include at least one of graphene or carbon nanostructure, and the metal thin film may include, for example, a metal thin film that is formed to a thin thickness of several nanometers to several tens of nanometers, or a single-layered or multi-layered metal thin film that is formed to a thin thickness of several nanometers to several tens of nanometers and doped with metal oxide.

For example, the lower auxiliary layer 10b may be an adhesion auxiliary layer that improves adhesion to a substrate (not shown) or a lower layer (not shown). A thickness of the lower auxiliary layer 10b may be, for example, less than or equal to about 30 nm, less than or equal to about 25 nm, or less than or equal to about 20 nm, and within the above range about 2 nm to about 30 nm, about 2 nm to about 25 nm, or about 2 nm to about 20 nm, but is not limited thereto.

For example, the upper auxiliary layer 10c may face the buffer layer 32 and/or the infrared photoelectric conversion layer 31, and may control the workfunction of the first electrode 10. For example, the upper auxiliary layer 10c may be the aforementioned light-transmitting auxiliary layer. For example, the upper auxiliary layer 10c may be between the reflective layer 10a and the infrared photoelectric conversion layer 31 to adjust the optical path length of a microcavity. A thickness of the upper auxiliary layer 10c may be, for example, less than or equal to about 80 nm, less than or equal to about 70 nm, less than or equal to about 60 nm, or less than or equal to about 50 nm, and within the above range about 5 nm to about 80 nm, about 5 nm to about 70 nm, about 5 nm to about 60 nm, or about 5 nm to about 50 nm, but is not limited thereto.

Herein, in some example embodiments, including the example embodiments shown in FIG. 2, the lower auxiliary layer 10b is disposed under the reflective layer 10a and the upper auxiliary layer 10c is disposed on (e.g., above) the reflective layer 10a, but the stacking position thereof may be variously changed. Also, at least one of the lower auxiliary layer 10b or the upper auxiliary layer 10c may be omitted.

Referring to FIG. 3, the second electrode 20 of the infrared sensor 100 according to some example embodiments includes a plurality of layers, for example, a semi-transmissive layer 20a, a lower auxiliary layer 20b, and an upper auxiliary layer 20c, unlike some example embodiments.

The semi-transmissive layer 20a may form a microcavity together with the aforementioned reflective layer 10a to adjust a wavelength (e.g., a detection wavelength) indicating electrical characteristics and efficiency of the infrared sensor 100. The semi-transmissive layer 20a may have a light transmittance between the light-transmitting layer and the reflective layer, and may have for example a light transmittance of about 10% to about 70%, about 20% to about 60%, or about 30% to about 50%. The semi-transmissive layer 20a may be configured to selectively transmit light in a particular (or, alternatively, predetermined) wavelength region and reflect or absorb light in other wavelength regions. The semi-transmissive layer 20a may include, for example, a relatively thin metal layer or alloy layer having a thickness of about 5 nm to about 40 nm, and may include, for example, silver (Ag), copper (Cu), aluminum (Al), magnesium (Mg), magnesium-silver (Mg—Ag), magnesium-aluminum (Mg—Al), or any combination thereof, but is not limited thereto. A thickness of the semi-transmissive layer 20a may be, for example less than or equal to about 80 nm, less than or equal to about 70 nm, less than or equal to about 60 nm, less than or equal to about 50 nm, or less than or equal to about 40 nm, within the above range about 5 nm to about 80 nm, about 5 nm to about 70 nm, about 5 nm to about 60 nm, about 5 nm to about 50 nm, about 5 nm to about 40 nm, about 10 nm to about 80 nm, about 10 nm to about 70 nm, about 10 nm to about 60 nm, about 10 nm to about 50 nm, about 10 nm to about 40 nm, about 20 nm to about 80 nm, about 20 nm to about 70 nm, about 20 nm to about 60 nm, about 20 nm to about 50 nm or about 20 nm to about 40 nm, but is not limited thereto.

At least one of the lower auxiliary layer 20b or the upper auxiliary layer 20c may be a light-transmitting auxiliary layer, and the light-transmitting auxiliary layer is the same as described above. For example, the upper auxiliary layer 20c may be a light-transmitting auxiliary layer. A thickness of the upper auxiliary layer 20c may be, for example, less than or equal to about 80 nm, less than or equal to about 70 nm, less than or equal to about 60 nm, or less than or equal to about 50 nm, and within the above range, about 5 nm to about 80 nm, about 5 nm to about 70 nm, about 5 nm to about 60 nm, or about 5 nm to about 50 nm, but is not limited thereto. For example, the lower auxiliary layer 20b may be an inorganic nanolayer. The inorganic nanolayer may face the buffer layer 33 and/or the infrared photoelectric conversion layer 31, and may be a very thin inorganic thin film having a thickness of several nanometers. A thickness of the inorganic nanolayer may be, for example, about 1 nm to about 5 nm, about 1 nm to about 4 nm, about 1 nm to about 3 nm, or about 1 nm to about 2 nm. The inorganic nanolayer may include an inorganic material having a workfunction shallower than that of the semi-transmissive layer 20a, for example, a lanthanide element such as ytterbium (Yb); calcium (Ca); potassium (K); barium (Ba); magnesium (Mg); lithium fluoride (LiF); or an alloy thereof. The inorganic nanolayer may lower an effective workfunction of the surface of the second electrode 20, thereby facilitating extraction of electric charges (e.g., electrons) moving from the photoelectric conversion layer 31 to the second electrode 20 to reduce residual charge carriers and exhibit high charge extraction efficiency.

As shown in FIG. 2 or 3, when the infrared sensor 100 includes a reflective electrode and a semi-transmissive layer as the first electrode 10 and second electrode 20, the infrared sensor 100 may form a microcavity structure. Due to the microcavity structure, incident light may be repeatedly reflected between the reflective layer and the semi-transmissive layer spaced apart by a particular (or, alternatively, predetermined) optical length to enhance light having a particular (or, alternatively, predetermined) wavelength spectrum. For example, light having a particular (or, alternatively, predetermined) wavelength spectrum among incident light may be repeatedly reflected between the reflective layer and the semi-transmissive layer to be modified. Among the modified lights, light of a wavelength spectrum corresponding to a resonance wavelength of the microcavity may be enhanced to exhibit amplified photoelectric conversion characteristics in a narrow wavelength region.

Due to the microcavity structure, a wavelength region exhibiting photoelectric conversion characteristics in the infrared sensor 100 may be different from a wavelength region of an absorption spectrum of the infrared photoelectric conversion layer 31. For example, the infrared photoelectric conversion layer 31 may have the absorption spectrum, for example from an absorption spectrum in a near-infrared wavelength region of the aforementioned compound, and may effectively photoelectrically convert light in a desired wavelength spectrum, for example, near-infrared to short-wavelength infrared of greater than or equal to about 1000 nm, greater than or equal to about 1100 nm, or greater than or equal to about 1200 nm according to the design of the microcavity structure of the infrared sensor 100. Accordingly, a limitation of the light absorption characteristics of the infrared photoelectric conversion layer 31 may be overcome and the infrared sensor 100 may be realized and effectively utilized according to the desired target wavelength for photoelectric conversion in the infrared wavelength region.

The photoelectric conversion characteristics of the infrared sensor 100 may be expressed as photoelectric conversion efficiency, and the photoelectric conversion efficiency may be in general evaluated from external quantum efficiency (EQE). The external quantum efficiency (EQE) may be a ratio of extracted electric charges relative to incident photons. In other words, when the external quantum efficiency (EQE) is high in a particular (or, alternatively, predetermined) wavelength region, the photoelectric conversion characteristics may also be high in the particular (or, alternatively, predetermined) wavelength region, and a current may be effectively generated.

External quantum efficiency (EQE) according to the wavelength of the infrared sensor 100 may be expressed as an external quantum efficiency (EQE) spectrum (EQE spectrum). For example, the wavelength region of the EQE spectrum of the infrared sensor 100 may be overlapped with a portion of the wavelength region of the absorption spectrum of the infrared photoelectric conversion layer 31, but as described above, due to the microcavity structure of infrared sensor 100, a wavelength region of an EQE spectrum of the infrared sensor 100 may be different from a wavelength region of an absorption spectrum of the infrared photoelectric conversion layer 31.

For example, the wavelength region of the EQE spectrum of the infrared sensor 100 may be overlapped with a long wavelength region (e.g., a tail portion of the absorption spectrum) among the wavelength region of the absorption spectrum of the infrared photoelectric conversion layer 31. The wavelength region of the EQE spectrum of the infrared sensor 100 may be located at a longer wavelength than the wavelength region of the absorption spectrum of the infrared photoelectric conversion layer 31.

The photoelectric conversion wavelength (e.g., detection wavelength) and detection selectivity of the infrared sensor 100 may be evaluated from the peak external quantum efficiency wavelength ($\lambda_{peak,EQE}$) and a full width half maximum (FWHM) of the EQE spectrum. Herein, the FWHM of the EQE spectrum may be a wavelength width corresponding to half the maximum value (peak) of the EQE in the corresponding EQE spectrum.

For example, the peak EQE wavelength ($\lambda_{peak,EQE}$) of the EQE spectrum of the infrared sensor 100 may be longer than the peak absorption wavelength (maximum absorption wavelength) ($\lambda_{peak,A}$) of the absorption spectrum of the infrared photoelectric conversion layer 31. For example, a difference between the peak EQE wavelength ($\lambda_{peak,EQE}$) of the EQE spectrum of the infrared sensor 100 and the peak absorption wavelength ($\lambda_{peak,A}$) of the absorption spectrum of the infrared photoelectric conversion layer 31 may be greater than or equal to about 100 nm. That is, the peak EQE wavelength ($\lambda_{peak,EQE}$) of the EQE spectrum of the infrared sensor 100 may be about 100 nm or more longer than the peak absorption wavelength ($\lambda_{peak,A}$) of the absorption spectrum of the infrared photoelectric conversion layer 31. Within the above range, the peak EQE wavelength ($\lambda_{peak,EQE}$) of the EQE spectrum of the infrared sensor 100 may be about 150 nm or more, about 200 nm or more, about 250 nm or more, about 300 nm or more, about 100 nm to about 700 nm, about 150 nm to about 700 nm, about 200 nm to about 700 nm, about 250 nm to about 700 nm, about 300 nm to about 700 nm, about 100 nm to about 500 nm, about 150 nm to about 500 nm, about 200 nm to about 500 nm, about 250 nm to about 500 nm, or about 300 nm to about 500 nm longer than the peak absorption wavelength ($\lambda_{peak,A}$) of the absorption spectrum of the infrared photoelectric conversion layer 31.

The FWHM of the EQE spectrum of the infrared sensor 100 may be narrower than the FWHM of the absorption spectrum of the infrared photoelectric conversion layer 31. For example, the light absorption characteristics of the infrared photoelectric conversion layer 31 may be exhibited by a combination of the light absorption characteristics of the aforementioned compound and the light absorption characteristics of the counterpart material. Accordingly, the absorption spectrum of the infrared photoelectric conversion layer 31 may include the absorption wavelength region of the aforementioned compound, but may appear in a wider wavelength region than the absorption spectrum of the aforementioned compound alone. For example, a FWHM of the absorption spectrum of the infrared photoelectric conversion layer 31 may be, for example, greater than or equal to about 100 nm, and within the above range, about 100 nm to about 800 nm, about 150 nm to about 800 nm, about 200 nm to about 800 nm, about 250 nm to about 800 nm, or about 300 nm to about 800 nm. On the other hand, a FWHM of the EQE spectrum of the infrared sensor 100 may be, for example, about 5 nm to about 200 nm, and within the above range, about 5 nm to about 150 nm, about 5 nm to about 120 nm, or about 5 nm to about 100 nm. Due to the peak EQE wavelength ($\lambda_{peak,EQE}$) and FWHM of the EQE spectrum, for example based upon the infrared sensor 100 including an infrared photoelectric conversion layer 31 that includes the aforementioned compound, the infrared sensor 100 having improved efficiency and high detection selectivity (e.g., improved sensitivity to incident light) in the near-infrared to short-wavelength infrared region may be implemented.

As an example, the peak external quantum efficiency ($EQE_{peak}$) at the peak EQE wavelength ($\lambda_{peak,EQE}$) of the EQE spectrum of the infrared sensor 100 may be greater than or equal to about 5%, within the above range, greater than or equal to about 7%, greater than or equal to about 10%, greater than or equal to about 12%, greater than or equal to about 15%, greater than or equal to about 18%, greater than or equal to about 20%, greater than or equal to about 22%, or greater than or equal to about 25%, within the above range, about 5% to about 80%, about 7% to about 80%, about 10% to about 80%, about 12% to about 80%, about 15% to about 80%, about 18% to about 80%, about 20% to about 80%, about 22% to about 80%, about 25% to about 80%, about 5% to about 70%, about 7% to about 70%, about 10% to about 70%, about 12% to about 70%, about 15% to about 70%, about 18% to about 70%, about 20% to about 70%, about 22% to about 70%, about 25% to about 70%, about 5% to about 50%, about 7% to about 50%, about 10% to about 50%, about 12% to about 50%, about 15% to about 50%, about 18% to about 50%, about 20% to about 50%, about 22% to about 50% or about 25% to about 50%.

The peak EQE wavelength ($\lambda_{peak,EQE}$) of the EQE spectrum of the infrared sensor 100 may correspond to the resonance wavelength of the microcavity of the infrared sensor 100, and accordingly, depending on the design of the microcavity structure of the infrared sensor 100, the desired target wavelength for photoelectric conversion may be controlled.

For example, in the microcavity structure of the infrared sensor 100, the resonance wavelength of the microcavity may be determined by adjusting a distance between the reflective layer and the semi-transmissive layer, that is, the optical length, and accordingly, the photoelectric conversion to occur at a desired target wavelength may be controlled.

For example, the peak wavelength ($\lambda_{peak,EQE}$) of the EQE spectrum of the infrared sensor 100 may be controlled by the thickness of the infrared photoelectric conversion layer 31. As the thickness of the infrared photoelectric conversion layer 31 increases, the optical length becomes longer, so that the resonance wavelength of the microcavity may shift toward a long wavelength region, and accordingly, the EQE spectrum of the infrared sensor 100 may shift toward the long wavelength region. The thickness of the infrared photoelectric conversion layer 31 may be selected within the aforementioned range.

For example, the peak EQE wavelength ($\lambda_{peak,EQE}$) of the EQE spectrum of the infrared sensor 100 may be controlled by the thickness of the upper auxiliary layer 10c (e.g., light-transmitting auxiliary layer) of the first electrode 10. As the thickness of the upper auxiliary layer 10c of the first electrode 10 increases, the optical length increases, so that the resonance wavelength of the microcavity may shift toward a longer wavelength region, and thus the EQE spectrum of the infrared sensor 100 may shift toward the longer wavelength region. The thickness of the upper auxiliary layer 10c of the first electrode 10 may be selected within the aforementioned range.

For example, the peak EQE wavelength ($\lambda_{peak,EQE}$) of the EQE spectrum of the infrared sensor 100 may be controlled by the thickness of the lower auxiliary layer 20b and/or the upper auxiliary layer 20c (e.g., light-transmitting auxiliary layer) of the second electrode 20. As the thickness of the lower auxiliary layer 20b and/or the upper auxiliary layer 20c of the second electrode 20 becomes thicker, the optical path length becomes longer, so that the resonance wavelength of the microcavity may shift toward a longer wavelength region, and accordingly, the EQE spectrum of the infrared sensor 100 may shift toward a longer wavelength region. Each thickness of the lower auxiliary layer 20b and/or the upper auxiliary layer 20c (e.g., light-transmitting auxiliary layer) of the second electrode 20 may be selected within the aforementioned range.

For example, a peak EQE wavelength ($\lambda_{peak,EQE}$) of the EQE spectrum of the infrared sensor 100 may be controlled by thicknesses of the buffer layers 32 and 33. As the buffer layers 32 and 33 become thicker, an optical length becomes longer, and a resonance wavelength of microcavity may shift toward a longer wavelength region, and accordingly, the external quantum efficiency (EQE) spectrum of the infrared sensor 100 may shift toward the longer wavelength region. The buffer layers 32 and 33 may have thicknesses from the above range.

The infrared sensor 100 may be designed to have a microcavity structure that may select a target wavelength for photoelectric conversion out of the infrared wavelength region and control the target wavelength and thus exhibit electrical characteristics at the target wavelength. Particularly, the infrared sensor 100 may be more widely used by effectively photoelectrically converting light in a long wavelength region, which may not be detected by a silicon photodiode, for example, in a wavelength region of greater than or equal to about 1000 nm, for example, greater than or equal to about 1050 nm, greater than or equal to about 1100 nm, greater than or equal to about 1150 nm, or greater than or equal to about 1200 nm.

The infrared sensor 100 may be applied to various fields for sensing light as an electrical signal in the infrared wavelength region, and may be, for example, an image sensor for improving sensitivity in a low light environment, a sensor for increasing detection capability of 3D images by broadening the dynamic range for detailed black and white contrast, a security sensor, a vehicle sensor, a biometric sensor, or the like. The biometric sensor may be, for example, an iris sensor; a distance sensor; a fingerprint sensor; a biosignal sensor such as a PPG sensor; or a living body imaging sensor such as a blood vessel imaging sensor, but is not limited thereto. The infrared sensor 100 may be applied to, for example, a CMOS infrared sensor or a CMOS image sensor.

The CMOS infrared sensor may include a plurality of pixels, and at least some of the plurality of pixels may include the aforementioned infrared sensor 100. The CMOS infrared sensor may include a plurality of infrared sensors 100 arranged in an array form along a row and/or column on a semiconductor substrate.

Figure 4:
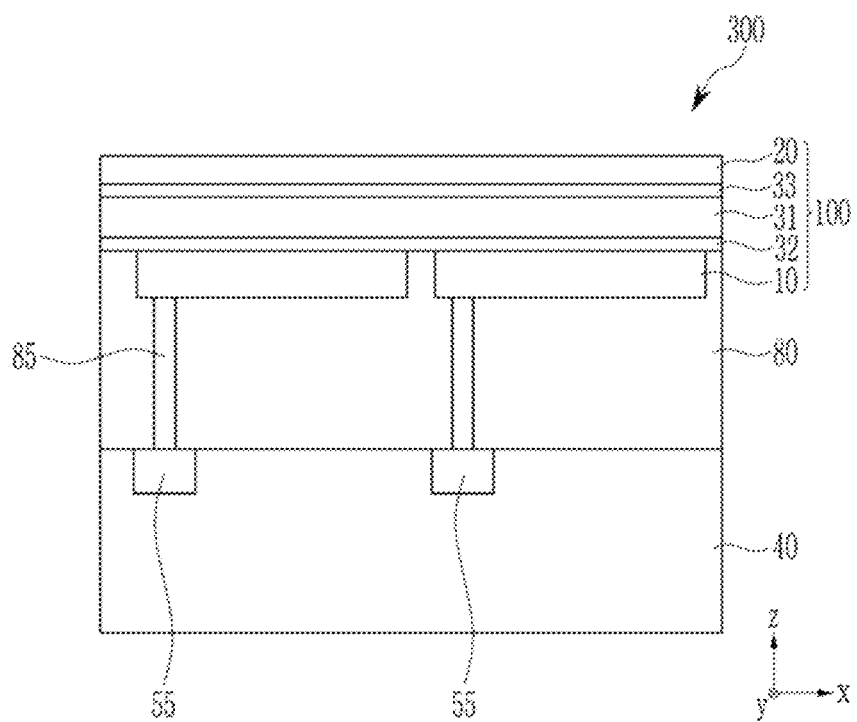
FIG. 4 is a cross-sectional view showing a CMOS infrared sensor according to some example embodiments.

FIG. 4 is a cross-sectional view showing a CMOS infrared sensor according to some example embodiments.

The CMOS infrared sensor 300 according to some example embodiments includes a semiconductor substrate 40, an insulation layer 80, and an infrared sensor 100.

The semiconductor substrate 40 may be a silicon substrate and is integrated with a transmission transistor (not shown)

and a charge storage 55. The charge storage 55 may be integrated in each pixel. The charge storage 55 is electrically connected to the infrared sensor 100 that will be described later and information of the charge storage 55 may be transferred by the transmission transistor.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed on the lower portion of the semiconductor substrate 40.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench may be filled with fillers.

The aforementioned infrared sensor 100 is formed on the insulation layer 80. The infrared sensor 100 includes the first electrode 10, the second electrode 20, the infrared photoelectric conversion layer 31, and optionally the buffer layers 32 and 33, as described above.

The descriptions of the first electrode 10, the second electrode 20, the infrared photoelectric conversion layer 31, and the buffer layers 32 and 33 are the same as described above. Among the light incident from the second electrode 20, light in the infrared wavelength region may be effectively absorbed by the infrared photoelectric conversion layer 31 and photoelectrically converted.

A focusing lens (not shown) may be further formed on the infrared sensor 100. The focusing lens may control a direction of incident light and gather the light in one region. The focusing lens may have a shape of, for example, a cylinder or a hemisphere, but is not limited thereto.

The infrared sensor 100 or the CMOS infrared sensor 300 may be included in a combination sensor including a plurality of sensors having different functions.

For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto. For example, one of the plurality of sensors having different functions may be an iris sensor and the other may be a depth sensor.

For example, a plurality of sensors having different functions may include, for example a first infrared light sensor configured to sense light in an infrared region having a first wavelength ($\lambda_1$) in an infrared wavelength region and a second infrared light sensor configured to sense light in an infrared region having a second wavelength ($\lambda_2$) in an infrared wavelength region.

The first wavelength ($\lambda_1$) and the second wavelength ($\lambda_2$) may be different from each other in the aforementioned infrared wavelength region. For example, a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) or the second wavelength ($\lambda_2$) may belong to a wavelength region of about 750 nm to about 1000 nm and the other of the first wavelength ($\lambda_1$) and the second wavelength ($\lambda_2$) may belong to a wavelength region of about 800 nm to about 1500 nm.

Figure 5:
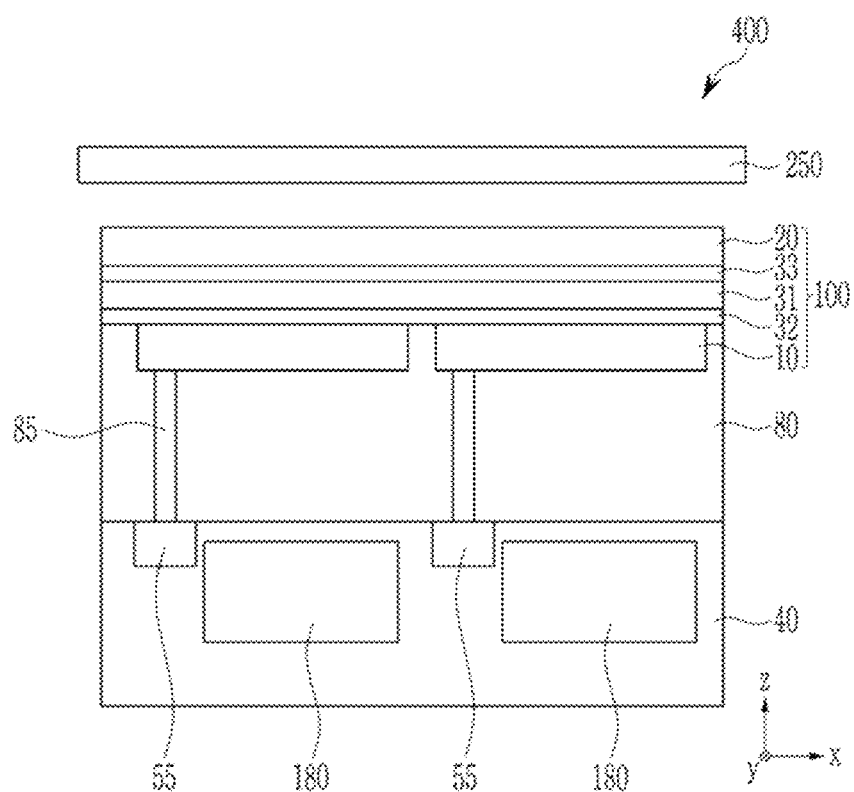
FIG. 5 is a cross-sectional view showing a combination sensor according to some example embodiments.

FIG. 5 is a cross-sectional view showing a combination sensor according to some example embodiments.

The combination sensor 400 according to some example embodiments includes an optical filter 250; an infrared sensor 100; an insulation layer 80; and a semiconductor substrate 40 in which a photodiode 180 and a charge storage 55 are integrated. The infrared sensor 100 and the photodiode 180 are stacked along the depth direction (e.g., a z direction) of the semiconductor substrate 40.

The optical filter 250 may be disposed on the front side of the combination sensor 400, and may be configured to selectively transmit light in the infrared wavelength region including the first wavelength ($\lambda_1$) and light in the infrared wavelength region including the second wavelength ($\lambda_2$) and block and/or absorb other light. Herein, other light may include light in an ultraviolet (UV) and visible region.

The infrared sensor 100 may be the first infrared sensor, and a detailed description thereof is the same as described above.

The photodiode 180 may be a second infrared sensor, and may be integrated in the semiconductor substrate 40. The semiconductor substrate 40 may be, for example, a silicon substrate, in which a photodiode 180, a charge storage 55, and a transfer transistor (not shown) are integrated.

The light introduced into the photodiode 180 is light that has passed through the optical filter 250 and the infrared sensor 100, and may be light in an infrared wavelength region of a particular (or, alternatively, predetermined) region including the second wavelength ($\lambda_2$). Infrared rays of a particular (or, alternatively, predetermined) region including the first wavelength ($\lambda_1$) may be substantially all absorbed in the infrared photoelectric conversion layer 31 of the infrared sensor 100 and may not reach the photodiode 180. Therefore, a separate filter for the wavelength selectivity of light entering the photodiode 180 may not be required. However, in case that light in the infrared wavelength region of the particular (or, alternatively, predetermined) region including the first wavelength ($\lambda_1$) is not all absorbed by the infrared photoelectric conversion layer 31, a separate filter (not shown) may be additionally provided between the infrared sensor 100 and the photodiode 180.

The combination sensor 400 according to some example embodiments may include two infrared light sensors respectively performing separately functions and thus may work as a combination sensor. In addition, two sensors performing separately functions are stacked in each pixel, and thus the number (e.g., quantity) of pixel performing functioning of each infrared sensor is twice increased while maintaining a size and resultantly, sensitivity of the resultant combination sensor 400 may be much improved.

Figure 6:
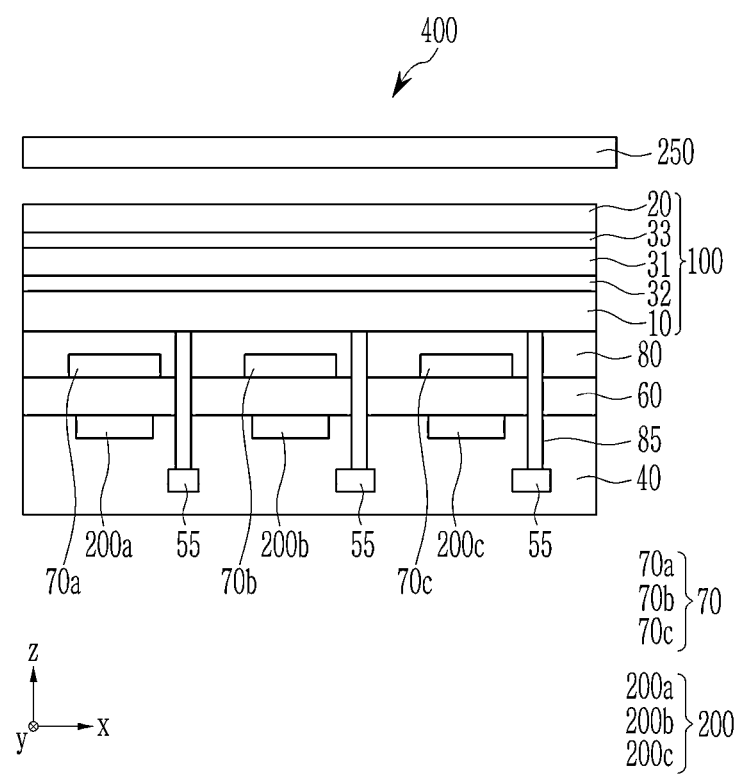
FIG. 6 is a cross-sectional view showing a combination sensor according to some example embodiments.

FIG. 6 is a cross-sectional view showing a combination sensor according to some example embodiments.

Referring to FIG. 6, the combination sensor 400 according to some example embodiments includes an infrared sensor 100, a visible light sensor 200, and an optical filter 250.

As described above, the infrared sensor 100 includes a first electrode 10, a second electrode 20, an infrared photoelectric conversion layer 31, and optionally buffer layers 32 and 33. Specific details are the same as described above.

The visible light sensor 200 is a sensor that senses light in a visible wavelength region, and may be a photodiode integrated in the semiconductor substrate 40. The visible light sensor 200 may be integrated in the semiconductor substrate 40, and may include a blue sensor 200a configured to sense light in a blue wavelength region, a green sensor 200b configured to sense light in a green wavelength region, and a red sensor 200c configured to sense light in a red wavelength region. The blue sensor 200a may be integrated in the blue pixel, the green sensor 200b may be integrated in the green pixel, and the red sensor 200c may be integrated in the red pixel.

The semiconductor substrate 40 may be, for example, a silicon substrate, and the visible light sensor 200, the charge storage 55, and the transfer transistor (not shown) are integrated therein. The visible light sensor 200 may be configured to sense light in the visible wavelength region that has passed through the optical filter 250, the infrared sensor 100, and the color filter layer 70, and the sensed information may be transmitted by a transmission transistor. The charge storage 55 is electrically connected to infrared sensor 100.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), or an alloy thereof, but are not limited thereto. Further, it is not limited to the structure, and the metal wire and pad may be disposed on the lower portions of the blue sensor 200a, the green sensor 200b, and the red sensor 200c.

A lower insulation layer 60 is formed on the semiconductor substrate 40. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 may include a blue filter 70a that selectively transmits light of a blue wavelength region, a green filter 70b that selectively transmits light of a green wavelength region, and a red filter 70c that selectively transmits light of a red wavelength region. The blue filter 70a, the green filter 70b, and the red filter 70c may be disposed to be overlapped with the blue sensor 200a, the green sensor 200b, and the red sensor 200c, respectively. The blue filter 70a may selectively transmit light in the blue wavelength region, the green filter 70b may selectively transmit light in the green wavelength region, and the red filter 70c may selectively transmit light in the red wavelength region. The transmitted light in the blue wavelength region may be introduced into (e.g., incident on) the blue sensor 200a, the transmitted light in the green wavelength region may be introduced into (e.g., incident on) the green sensor 200b, and the transmitted light in the red wavelength region may be introduced into (e.g., incident on) the red sensor 200c. However, the present inventive concepts are not limited thereto, and at least one of the blue filter 70a, the green filter 70b, or the red filter 70c may be replaced with a yellow filter, a cyan filter, or a magenta filter. Here, although the structure in which the color filter layer 70 is disposed between the infrared sensor 100 and the visible light sensor 200 is shown, the present inventive concepts are not limited thereto and may be disposed on the upper portion of the infrared sensor 100.

An upper insulation layer 80 is formed on the color filter layer 70. The upper insulation layer 80 may be, for example, a planarization layer and may be made of an inorganic insulating material such as a silicon oxide and/or a silicon nitride, or a low dielectric constant (low K) material such as SiC, SiCOH, SiCO, and SiOF. The lower insulation layer 60 and upper insulation layer 80 may have trenches 85 exposing charge storage 55. The trenches 85 may be filled with a filler material. At least one of the lower insulation layer 60 or the upper insulation layer 80 may be omitted.

The optical filter 250 may be disposed on the upper portions of the visible light sensor 200 and the infrared sensor 100, and may be disposed on the whole surfaces of the visible light sensor 200 and the infrared sensor 100. The optical filter 250 may selectively transmit light in a particular (or, alternatively, predetermined) wavelength region including the wavelength to be sensed by the visible light sensor 200 and the wavelength to be sensed by the infrared sensor 100 and may block other light by reflection or absorption.

A focusing lens (not shown) may be further formed on the upper portion or lower portion of the optical filter 250. The focusing lens may control a direction of incident light and gather the light in one region. The focusing lens may have a shape of, for example, a cylinder or a hemisphere, but is not limited thereto.

Figure 7:
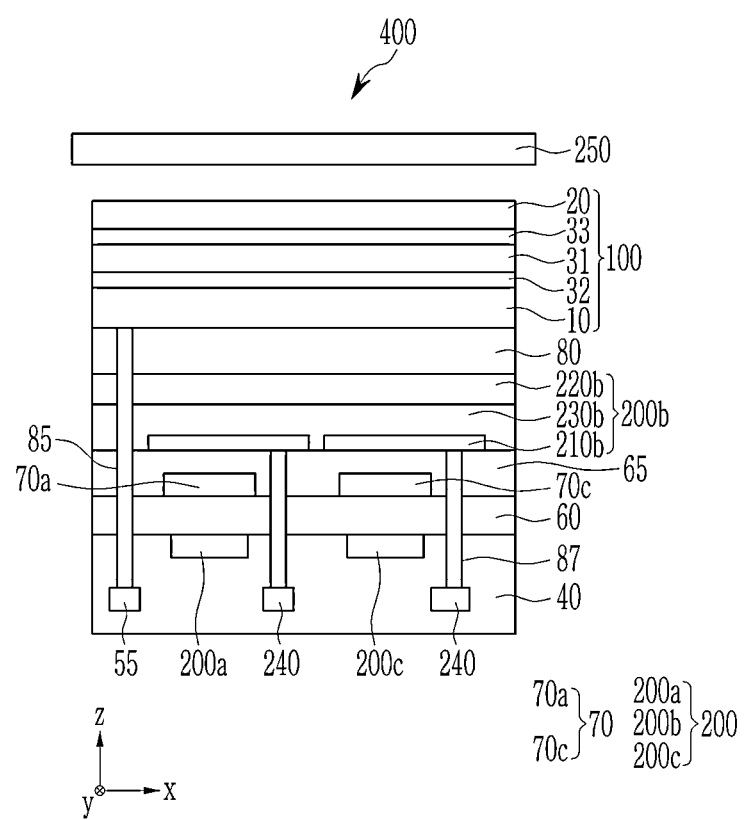
FIG. 7 is a cross-sectional view showing a combination sensor according to some example embodiments.

FIG. 7 is a cross-sectional view showing a combination sensor according to some example embodiments.

The combination sensor 400 according to some example embodiments includes a semiconductor substrate 40, a color filter layer 70, an infrared sensor 100, a visible light sensor 200, and an optical filter 250, like some example embodiments.

The infrared sensor 100 includes a first electrode 10, a second electrode 20, an infrared photoelectric conversion layer 31, and optionally buffer layers 32 and 33, and the specific details are the same as described above. In some example embodiments, the first electrode 10 may be a common electrode vertically overlapping each of the sensors 200a, 200b, and 200c. In some example embodiments, the first electrode 10 may include separate first electrode portions that are each connected to a separate charge storage 55 via a separate trench 85 and vertically overlapping a separate one of the sensors 200a, 200b, or 200c, where the separate first electrode portions are isolated from direct contact with each other (for example, by at least the upper insulation layer 80), for example as shown in at least FIGS. 4-5.

The visible light sensor 200 may be a combination of a photodiode integrated on the semiconductor substrate 40 and a visible light photoelectric conversion device disposed on the semiconductor substrate 40.

In the semiconductor substrate 40, a blue sensor 200a, a red sensor 200c, charge storages 55 and 240, and a transfer transistor (not shown) are integrated. The blue sensor 200a and the red sensor 200c are photodiodes and are disposed to be spaced apart in the plane direction (e.g., an xy direction) of the semiconductor substrate 40. The blue sensor 200a is integrated in the blue pixel and the red sensor 200c is integrated in the red pixel.

A lower insulation layer 60 and a color filter layer 70 are formed on the semiconductor substrate 40. The color filter layer 70 includes a blue filter 70a overlapped with the blue sensor 200a and a red filter 70c overlapped with the red sensor 200c.

An intermediate insulation layer 65 is formed on the color filter layer 70. The lower insulation layer 60 and intermediate insulation layer 65 may have trenches 85 and 87 exposing charge storages 55 and 240. The trenches 85 and 87 may be filled with a filler material. At least one of the lower insulation layer 60 or the intermediate insulation layer 65 may be omitted.

A green sensor 200b is formed on the intermediate insulation layer 65. The green sensor 200b may be a visible light photoelectric conversion device and may be formed on the whole surface of the semiconductor substrate 40. The green sensor 200b includes a lower electrode 210b and an upper electrode 220b facing each other and a green photoelectric conversion layer 230b disposed between the lower electrode 210b and the upper electrode 220b. Either one of the lower electrode 210b or the upper electrode 220b is an anode, and the other one is a cathode.

Both of the lower electrode 210b and the upper electrode 220b may be light-transmitting electrodes. The light-transmitting electrode may be for example made of a transparent conductor such as indium tin oxide (ITO), indium zinc oxide (IZO) or may be a metal thin film that is formed with a thin thickness of several nanometers to several tens of nanometer thickness or a single-layered or multi-layered metal thin film the is formed with a thin thickness of several nanometers to tens of nanometer thickness and doped with metal oxide.

The green photoelectric conversion layer 230b may be configured to selectively absorb light in a green wavelength region and allow light from wavelength regions other than the green wavelength region, that is, the blue wavelength region and the red wavelength region, to pass through. The green photoelectric conversion layer 230b may be formed on the whole surface of the combination sensor 400. As a result, it is configured to selectively absorb light in a green wavelength region from the whole surface of the combination sensor 400 and increases light areas, thus having high absorption efficiency.

The green photoelectric conversion layer 230b may be configured to selectively absorb light in a green wavelength region, forms excitons, and separates the excitons into holes and electrons. The separated holes move towards the anode which is one of the lower electrode 210b or the upper electrode 220b, while the separated electrons move toward the cathode which is the other of the lower electrode 210b or the upper electrode 220b, and thus a photoelectric conversion effect may be obtained. The separated electrons and/or holes may be collected in the charge storage 240.

In some example embodiments, the green photoelectric conversion layer 230b may include at least one p-type semiconductor and at least one n-type semiconductor for photoelectric conversion of the absorbed light. The p-type semiconductor and the n-type semiconductor may form a pn junction, generate excitons by receiving light from the outside, and then separate the generated excitons into holes and electrons. At least one of the p-type semiconductor or the n-type semiconductor may be a light absorbing material, and for example, each of the p-type semiconductor and the n-type semiconductor may be a light absorbing material configured to selectively absorb light in the green wavelength region.

For example, a p-type semiconductor of the green photoelectric conversion layer 230b may be an organic material having a core structure including an electron donating moiety EDM, a π-conjugated linking moiety LM, and an electron accepting moiety EAM and represented by Chemical Formula 8.

EDM-LM-EAM    [Chemical Formula 8]

In Chemical Formula 8,

EDM may be an electron donating moiety,

EAM may be an electron accepting moiety, and

LM may be a pi conjugated linking moiety to link the electron donating moiety and the electron accepting moiety.

For example, the p-type semiconductor of the green photoelectric conversion layer 230b may be represented by Chemical Formula 9.

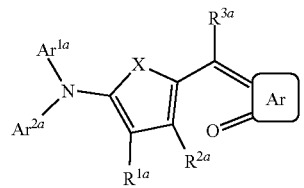

[Chemical Formula 9]

In Chemical Formula 9,

X may be O, S, Se, Te, SO, $SO_2$, $CR^bR^c$, or $SiR^dR^e$,

Ar may be a substituted or unsubstituted C6 to C30 arylene group, a substituted or unsubstituted C3 to C30 heterocyclic group, or a fused ring of two or more selected therefrom, $Ar^{1a}$ and $Ar^{2a}$ may each independently be a substituted or unsubstituted C6 to C30 aryl(ene) group or a substituted or unsubstituted C3 to C30 heteroaryl(ene) group, $R^{1a}$ to $R^{3a}$ and $R^b$ to $R^e$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $Ar^{1a}$, $Ar^{2a}$, $R^{1a}$, and $R^{2a}$ may each independently be present, or two adjacent ones may be linked to each other to form a ring.

For example, $Ar^{1a}$ and $Ar^{2a}$ may each independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ may be linked to each other to form a ring.

For example, $Ar^{2a}$ and $R^{1a}$ may be linked to each other to form a ring.

For example, the n-type semiconductor of the green photoelectric conversion layer 230b may be fullerene or a fullerene derivative, thiophene or a thiophene derivative, or any combination thereof, but is not limited thereto.

An auxiliary layer (not shown) may be further included between the lower electrode 210b and the green photoelectric conversion layer 230b and/or between the upper electrode 220b and the green photoelectric conversion layer 230b. The auxiliary layer may be a charge auxiliary layer, a light absorption auxiliary layer, or any combination thereof, but is not limited thereto.

Herein, an example structure in which the blue sensor 200a and the red sensor 200c are photodiodes and the green sensor 200b is a photoelectric conversion device is described, but is not limited thereto. The blue sensor 200a and the green sensor 200b may be photodiodes and the red sensor 200c may be a photoelectric conversion device or the green sensor 200b and the red sensor 200c may be photodiodes and the blue sensor 200a may be a photoelectric conversion device.

On the green sensor 200b, an upper insulation layer 80 is formed, and on the upper insulation layer 80, the infrared sensor 100 and the optical filter 250 are disposed. The infrared sensor 100 and the optical filter 250 are the same as described above.

In FIG. 7, a structure in which the infrared sensor 100 is disposed on the green sensor 200b, which is one of the visible light photoelectric conversion devices, is illustrated, but is not limited thereto, and the green sensor 200b may be disposed on the infrared sensor 100.

The combination sensor 400 according to some example embodiments may include an infrared sensor 100 and a visible light sensor 200 stacked along the depth direction (e.g., a z direction) of the semiconductor substrate 40 and the visible light sensor 200 also has a structure in which a photodiode and a visible light photoelectric conversion device are stacked, thereby further reducing an area of the combination sensor and thus implementing miniaturization of the combination sensor.

Figure 8:
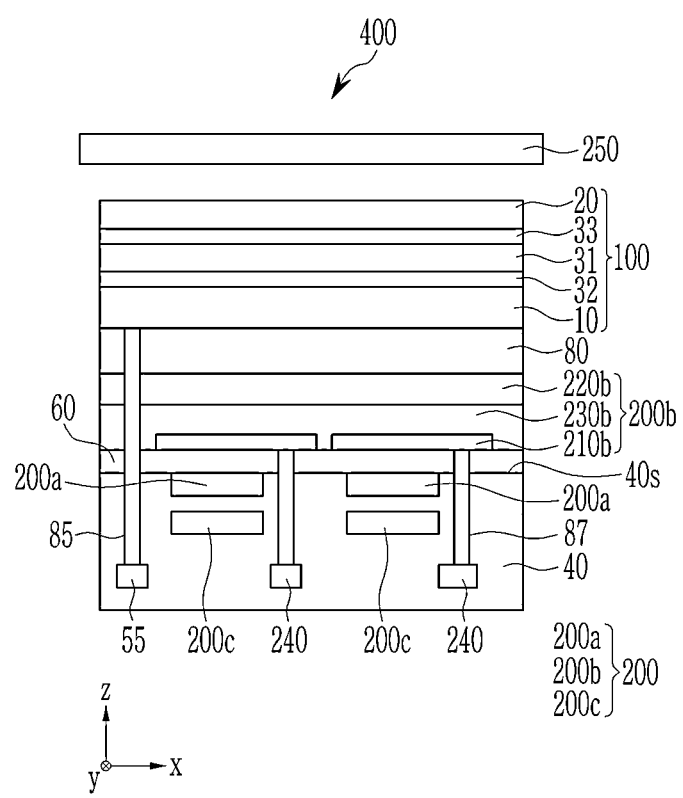
FIG. 8 is a cross-sectional view schematically showing a combination sensor according to some example embodiments.

FIG. 8 is a cross-sectional view schematically showing a combination sensor according to some example embodiments.

Referring to FIG. 8, the combination sensor 400 according to some example embodiments includes a semiconductor substrate 40, an infrared sensor 100, a visible light sensor 200, and an optical filter 250 as in some example embodiments.

The infrared sensor 100 includes a first electrode 10, a second electrode 20, an infrared photoelectric conversion layer 31, and optionally buffer layers 32 and 33, and details are the same as described above.

The visible light sensor 200 include the blue sensor 200a and the red sensor 200c integrated on the semiconductor substrate 40 and a green sensor 200b disposed on the semiconductor substrate 40, wherein the blue sensor 200a and the red sensor 200c may be photodiodes, and the green sensor 200b may be a visible light photoelectric conversion device. The green sensor 200b includes the lower electrode 210b, the green photoelectric conversion layer 230b, and the upper electrode 220b.

However, in the combination sensor 400 according to some example embodiments, the blue sensor 200a and the red sensor 200c integrated in the semiconductor substrate 40 are stacked along a depth direction (e.g., a z direction) of the semiconductor substrate 40. The blue sensor 200a and the red sensor 200c may be configured to selectively absorb and sense light in each wavelength region along the stacking depth (e.g., vertical direction) from the surface 40s of the semiconductor substrate 40 (e.g., extending perpendicular to the surface 40s). In other words, the red sensor 200c absorbing red light in the long wavelength region may be disposed deeper than the blue sensor 200a absorbing blue light in the short wavelength region from the surface of the semiconductor substrate 40. In this way, since absorption wavelengths are separated along the stacking depth from the surface 40s of the semiconductor substrate 40, the color filter layer 70 for separating the absorption wavelengths may be omitted.

Herein, the blue sensor 200a and the red sensor 200c is, for example, illustrated to be photodiodes, while the green sensor 200b is to be a photoelectric conversion device, but the present inventive concepts are not limited thereto, and the blue sensor 200a and the green sensor 200b may be photodiodes, while the red sensor 200c may be a photoelectric conversion device, or the green sensor 200b and the red sensor 200c may be photodiodes, while the blue sensor 200a may be a photoelectric conversion device.

FIG. 8 exhibits a structure that the infrared sensor 100 is disposed on the green sensor 200b, one of the visible light photoelectric conversion devices, but the present inventive concepts are not limited thereto, and the green sensor 200b may be disposed on the infrared sensor 100.

The combination sensor 400 according to some example embodiments is a combination sensor equipped with the infrared sensor 100 and the visible light sensor 200 which are stacked each other, the visible light sensor 200 is also equipped with a photodiode and a visible light photoelectric conversion device which are stacked each other, and the photodiode also has a stacked structure, resultantly reducing the area of the combination sensor and thus realizing downsizing of the combination sensor. In addition, the combination sensor 400 according to some example embodiments may include no separate color filter layer and thereby may simplify the structure and the process.

Figure 9:
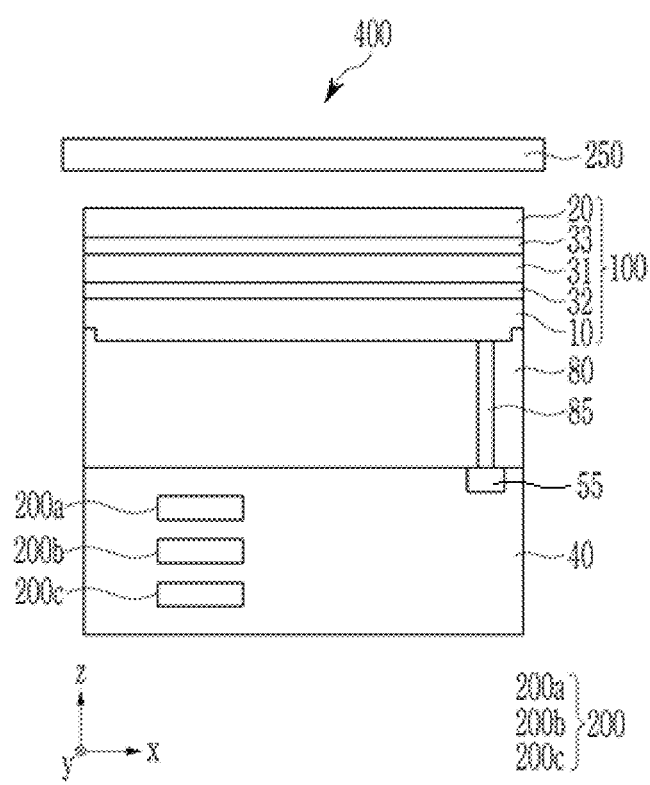
FIG. 9 is a cross-sectional view schematically showing a combination sensor according to some example embodiments.

FIG. 9 is a cross-sectional view schematically showing a combination sensor according to some example embodiments.

Referring to FIG. 9, the combination sensor 400 according to some example embodiments, as in some example embodiments, includes the semiconductor substrate 40, the infrared sensor 100, the visible light sensor 200, and the optical filter 250.

The infrared sensor 100, as described above, includes the first electrode 10, the second electrode 20, the infrared photoelectric conversion layer 31, and optionally, the buffer layers 32 and 33, and details thereof are the same as described above.

The visible light sensor 200 includes the blue sensor 200a, the green sensor 200b, and the red sensor 200c integrated in the semiconductor substrate 40. The blue sensor 200a, the green sensor 200b, and the red sensor 200c are stacked in the semiconductor substrate 40 along the depth direction (e.g., a z direction, also referred to herein as a vertical direction) of the semiconductor substrate 40. The blue sensor 200a, the green sensor 200b, and the red sensor 200c may separate absorption wavelengths along the stacking depth, and accordingly, the color filter layer 70 may be omitted. Between the semiconductor substrate 40 and the infrared sensor 100, the insulation layer 60 may be formed, and the insulation layer 60 has the trench 85. The semiconductor substrate 40 includes the charge storage 55 connected to the infrared sensor 100.

Figure 10:
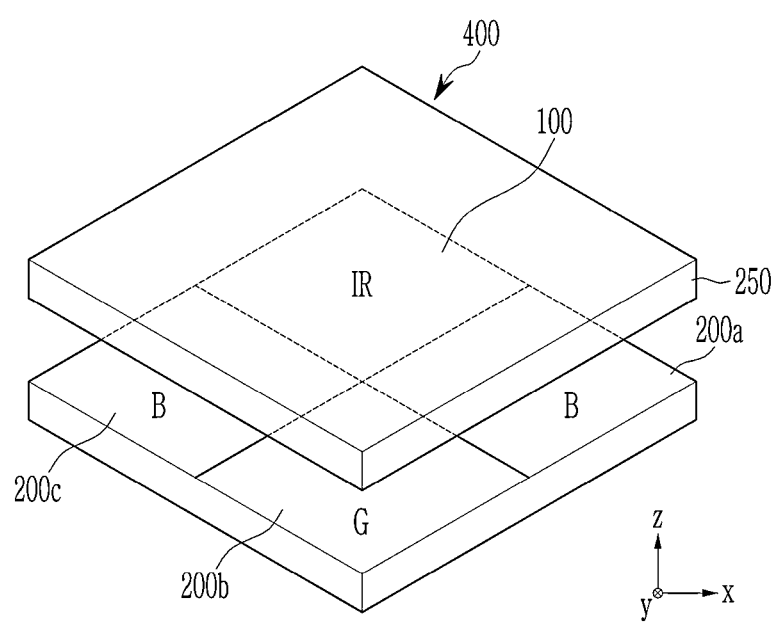
FIG. 10 is a perspective view schematically showing a combination sensor according to some example embodiments.
Figure 11:
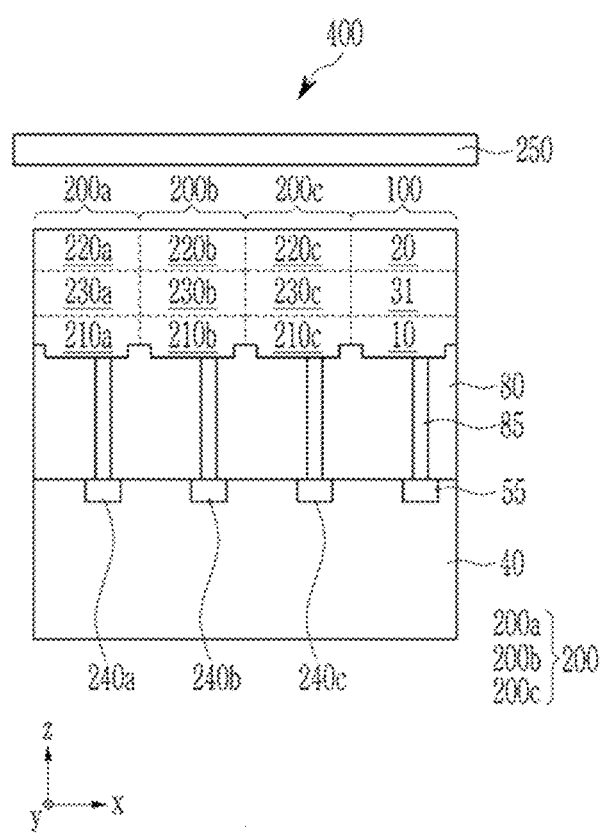
FIG. 11 is a cross-sectional view schematically showing the combination sensor of FIG. 10 according to some example embodiments.

FIG. 10 is a perspective view schematically showing a combination sensor according to some example embodiments, and FIG. 11 is a cross-sectional view schematically showing the combination sensor of FIG. 10 according to some example embodiments.

Referring to FIGS. 10 and 11, the combination sensor 400 according to some example embodiments, as in some example embodiments including the example embodiments shown in at least FIGS. 5-9, includes the semiconductor substrate 40; the infrared sensor 100; the visible light sensor 200; the insulation layer 80; and the optical filter 250. The visible light sensor 200 includes the blue sensor 200a, the green sensor 200b, and the red sensor 200c.

The infrared sensor 100, the blue sensor 200a, the green sensor 200b, and the red sensor 200c may be aligned side by side along a plane direction (e.g., an xy direction) of the semiconductor substrate 40 and respectively connected to charge storages 55, 240a, 240b, and 240c integrated in the semiconductor substrate 40.

The blue sensor 200a, the green sensor 200b, and the red sensor 200c may be each visible light photoelectric conversion device.

The infrared sensor 100 includes a first electrode 10, a second electrode 20, an infrared photoelectric conversion layer 31, and optionally auxiliary layers (not shown), and details are the same as described above.

The blue sensor 200a includes a lower electrode 210a, a blue photoelectric conversion layer 230a, and an upper electrode 220a. The green sensor 200b includes a lower electrode 210b, a green photoelectric conversion layer 230b, and an upper electrode 220b. The red sensor 200c includes a lower electrode 210c, a red photoelectric conversion layer 230c, and an upper electrode 220c. The blue photoelectric conversion layer 230a may photoelectrically convert by selectively absorbing light in the blue wavelength region, the green photoelectric conversion layer 230b may photoelectrically convert by selectively absorbing light in the green wavelength region, and the red photoelectric conversion layer 230c may photoelectrically convert by selectively absorbing light in a red wavelength region. The blue photoelectric conversion layer 230a and the red photoelectric conversion layer 230c may have a similar material composition as described with regard to the green photoelectric conversion layer 230b. The blue, green, and red photoelectric conversion layers 230a, 230b, and 230c may include different additive and/or dopant materials to configure the respective photoelectric conversion layers to selectively absorb different wavelength regions of incident light. Such different additive and/or dopant materials may include small molecules (low molecular weight compounds) including fluorine, a monovalent functional group substituted with fluorine, a cyano group, a monovalent functional group substituted with a cyano group, or any combination thereof. In some example embodiments, the blue, green, and red photoelectric conversion layers 230a, 230b, and 230c may not include any additive and/or dopant materials and may include different materials that may, for example, be represented by Chemical Formulas 8 and/or 9.

In some example embodiments, two or more, or all of the upper electrodes 220a, 220b, and/or 220c, and/or the second electrode 20 may be separate portions of a common electrode that is a single piece of material extending through two or more, or all of the sensors 200a, 200b, 200c, and 100. In some example embodiments, the upper electrodes 220a, 220b, and 220c, and second electrode 20 may be pixel electrodes that are separate pieces of material located in separate, respective sensors 200a, 200b, 200c, and 100. In some example embodiments, two or more, or all of the lower electrodes 210a, 210b, and/or 210c, and/or the first electrode 10 may be separate portions of a common electrode that is a single piece of material extending through two or more, or all of the sensors 200a, 200b, 200c, and 100. In some example embodiments, the lower electrodes 210a, 210b, and 210c, and the first electrode 10 may be pixel electrodes that are separate pieces of material located in separate, respective sensors 200a, 200b, 200c, and 100 and which may be isolated from direct contact with each other for example by the insulation layer 80, for example as shown in FIGS. 4 and 5 with regard to the first electrodes 10 and insulation layer 80 therein.

In some example embodiments, two or more, or all of the photoelectric conversion layers 230a, 230b, 230c, and 31 may be separate portions of a common layer that is a single piece of material extending through two or more, or all of the sensors 200a, 200b, 200c, and 100. In some example embodiments, the photoelectric conversion layers 230a, 230b, 230c, and 31 may be separate layers that are separate pieces of material located in separate, respective sensors 200a, 200b, 200c, and 100.

Figure 12:
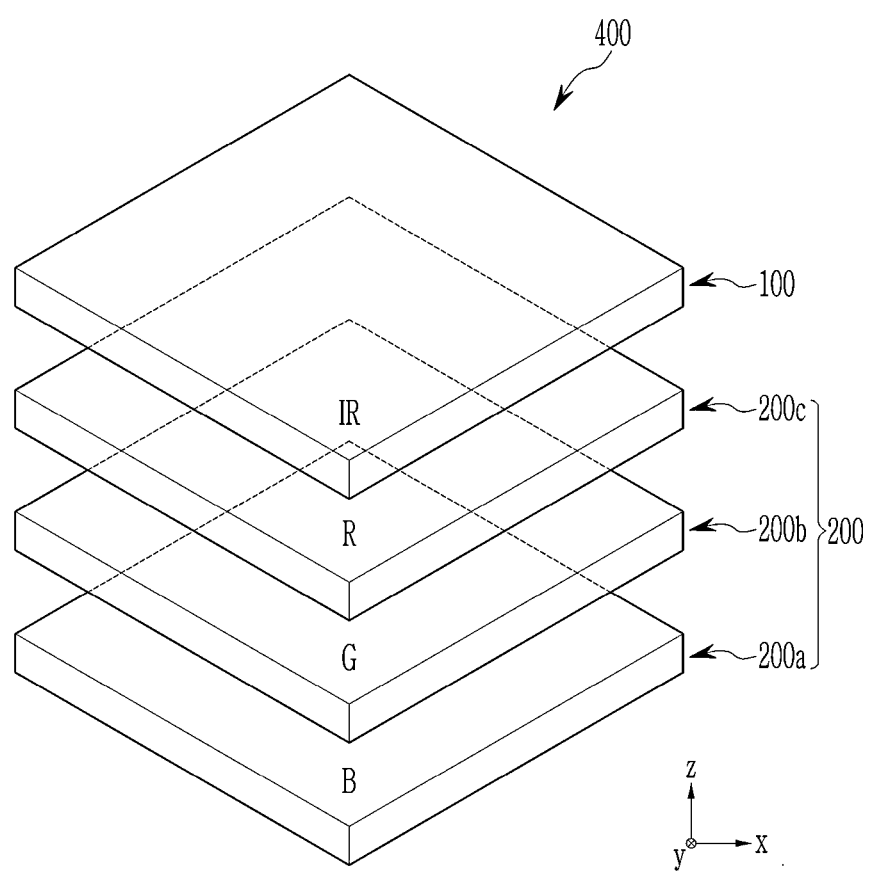
FIG. 12 is a perspective view schematically showing a combination sensor according to some example embodiments.
Figure 13:
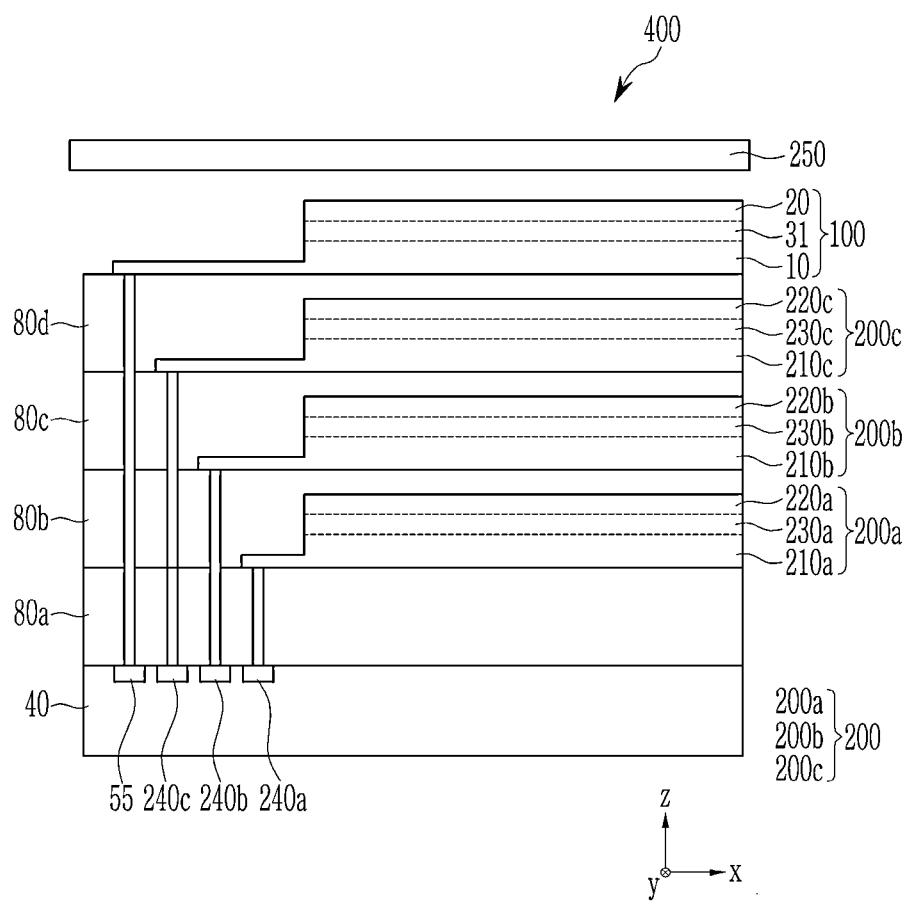
FIG. 13 is a cross-sectional view schematically showing the combination sensor of FIG. 12 according to some example embodiments.

FIG. 12 is a perspective view schematically showing a combination sensor according to some example embodiments, and FIG. 13 is a cross-sectional view schematically showing the combination sensor of FIG. 12 according to some example embodiments.

Referring to FIGS. 12 and 13, the combination sensor 400 according to some example embodiments includes a semiconductor substrate 40; infrared sensor 100; a visible light sensor 200; and an optical filter 250. The visible light sensor 200 includes a blue sensor 200a, a green sensor 200b, and a red sensor 200c.

The infrared sensor 100, the blue sensor 200a, the green sensor 200b, and the red sensor 200c may be stacked along the depth direction (e.g., a z direction) of the semiconductor substrate 40 and electrically connected to each charge storage 55, 240a, 240b, and 240c integrated in the semiconductor substrate 40.

The infrared sensor 100 includes a first electrode 10, a second electrode 20, an infrared photoelectric conversion layer 31, and optionally buffer layers (not shown), and details are the same as described above.

The blue sensor 200a includes a lower electrode 210a, a blue photoelectric conversion layer 230a, and an upper electrode 220a. The green sensor 200b includes a lower electrode 210b, a green photoelectric conversion layer 230b, and an upper electrode 220b. The red sensor 200c includes a lower electrode 210c, a red photoelectric conversion layer 230c, and an upper electrode 220c.

Each insulation layer 80a, 80b, 80c, and 80d may have a same composition as the insulation layer 80, intermediate insulation layer 65, and/or lower insulation layer 60 and may be disposed between the semiconductor substrate 40 and the blue sensor 200a, between the blue sensor 200a and the green sensor 200b, between the green sensor 200b and the red sensor 200c, and between the red sensor 200c and the infrared sensor 100.

Some example embodiments illustrate a structure that the infrared sensor 100, the blue sensor 200a, the green sensor 200b, and the red sensor 200c are sequentially stacked but is not limited thereto, and the stacking order may be unlimitedly various.

The aforementioned infrared sensor 100, the CMOS infrared sensor 300, or the combination sensor 400 may be applied to (e.g., included in) various electronic devices, for example, a cell phone, a digital camera, a biometric device, a security device, auto electronic parts, and/or the like, but is not limited thereto.

Figure 14:
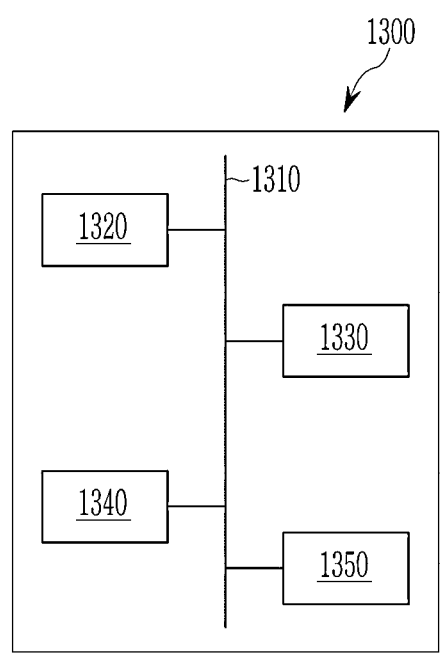
FIG. 14 is a schematic diagram of an electronic device according to some example embodiments.

FIG. 14 is a schematic view of an electronic device according to some example embodiments.

Referring to FIG. 14, an electronic device 1300 includes a processor 1320, a memory 1330, a sensor 1340, and a display device 1350 electrically connected through a bus 1310.

The processor 1320 may include one or more instances (e.g., units, articles, etc.) of processing circuitry such as an instance of hardware including logic circuits, a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may for example control an operation of the sensor 1340.

The memory 1330 may be a non-transitory computer readable storage medium, such as, for example, as a solid state drive (SSD) and may store an instruction program (e.g., program of instructions), and the processor 1320 may perform a function related to the sensor 1340 by executing the stored instruction program.

The sensor 1340 may include (e.g., may be) the aforementioned infrared sensor 100, CMOS infrared sensor 300, or combination sensor 400. The processor 1320 may perform a memory program and thus at least one function. The processor 1320 may additionally perform a memory program and thus display an image on the display device 1350 (e.g., a light emitting diode (LED), an organic LED (OLED) display screen device, etc.). The processor 1320 may generate an output.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to the foregoing embodiments may be recorded in a non-transitory computer readable storage device including program instructions for implementing various operations of some example embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of any of the example embodiments.

Hereinafter, some example embodiments are illustrated in more detail with reference to the following examples. However, the present scope of the inventive concepts is not limited to the following examples.

Synthesis of Compounds

Synthesis Example 1

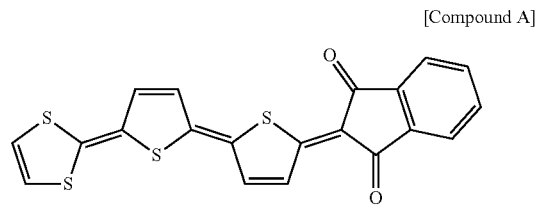 [SMILES: O=C1C(=c2cc/c(=c3/ccc(=C4SC=CS4)s3)s2)C(=O)c2ccccc21]

[Compound A]

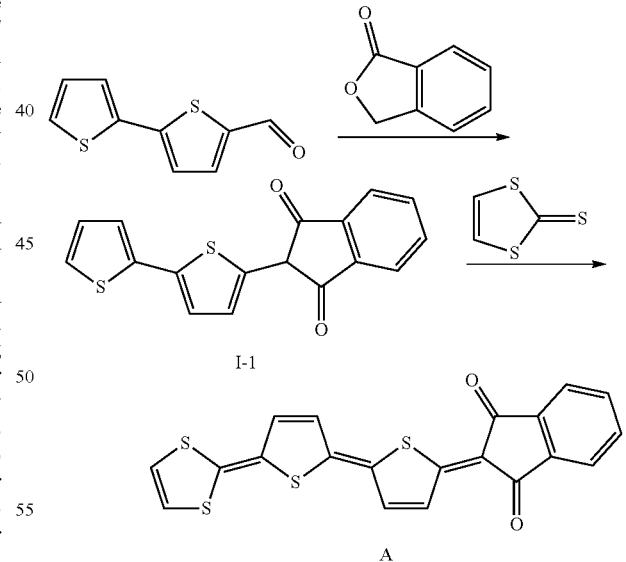

[Reaction Scheme 1]

(1) Synthesis of Compound I-1

2,2'-bithiophene-5-carbaldehyde (5.8 g, 30 mmol), phthalide (4.0 g, 30 mmol), and sodium ethoxide (21 wt % in ethanol, 23.4 mL, 69 mmol) are dissolved in 150 mL of ethanol and 30 mL of ethyl acetate and then, stirred at 80° C. for 24 hours. When a reaction is completed, the resultant is dissolved again in 200 mL of $H_2O$ after all evaporating organic solvents, and 70 mL of 1N HCl is slowly added thereto to precipitate a material. The precipitated material is filtered and then, separated and purified through silica gel column chromatography (acetone:chloroform=1:10 (a volume ratio)), obtaining 8.0 g of Compound I-1 (Intermediate). A yield is 86%.

NMR (500 MHz, CDCl$_3$): 8.10 (m, 2H), 7.94 (m, 2H), 7.21 (d, 1H), 7.16 (d, 1H), 7.08 (d, 1H), 7.02 (d, 1H), 7.00 (t, 1H), 4.49 (s, 1H).

(2) Synthesis of Compound A 1,3-dithiole-2-thione (2.0 g, 14.5 mmol) and dimethyl sulfate (1.8 g, 14.5 mmol) are dissolved in 100 mL of acetic acid and then, stirred at 90° C. for 2 hours. Subsequently, Compound I-1 (4.5 g, 14.5 mmol) is dissolved in a mixed solvent of 100 mL of acetic acid and 50 mL of triethylamine, and this solution is added to the first reactants and then, stirred at 90° C. for 12 hours. When a reaction is completed, 500 mL of acetone is poured thereinto and filtered. Subsequently, a product therefrom is three times more purified through reprecipitation in acetone and finally purified through sublimation, obtaining Compound A.

NMR (500 MHz, DMSO-d$_6$): 8.04 (d, 1H), 7.98 (d, 1H), 7.91 (d, 1H), 7.81 (s, 2H), 7.60 (d, 1H), 7.54 (m, 2H), 7.48 (m, 2H).

Synthesis Example 2

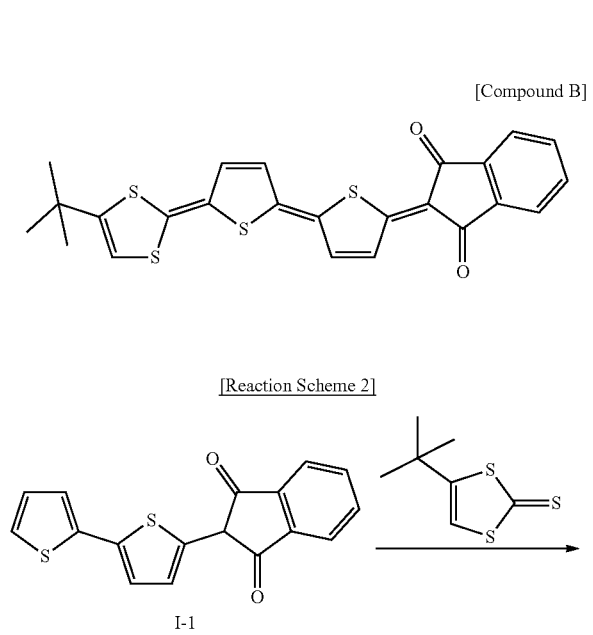

[Reaction Scheme 2]

4-(tert-butyl)-1,3-dithiole-2-thione (2.0 g, 10.6 mmol) and dimethyl sulfate (1.5 g, 11.6 mmol) are dissolved in 75 mL of acetic acid and then, stirred at 90° C. for 2 hours. Subsequently, Compound I-1 (3.0 g, 9.7 mmol) is dissolved in 60 mL of acetic acid and 10 mL of triethylamine, and this solution is added to the resultant and then, stirred at 90° C. for 12 hours. When a reaction is completed, the resultant is poured into 500 mL of ethanol and then, filtered. A product therefrom is three times more purified through reprecipitation in ethanol and finally purified through sublimation, obtaining Compound B.

NMR (500 MHz, DMSO-d$_6$): 8.04 (d, 1H), 7.92 (d, 1H), 7.91 (d, 1H), 7.59 (d, 1H), 7.55 (m, 2H), 7.50 (m, 2H), 7.42 (s, 1H), 1.36 (s, 9H).

Synthesis Example 3

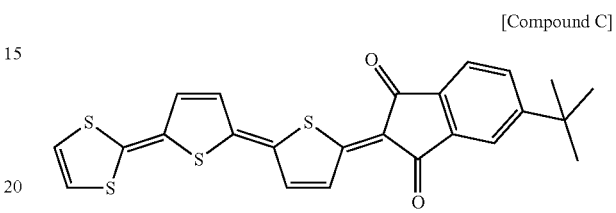

[Compound C]

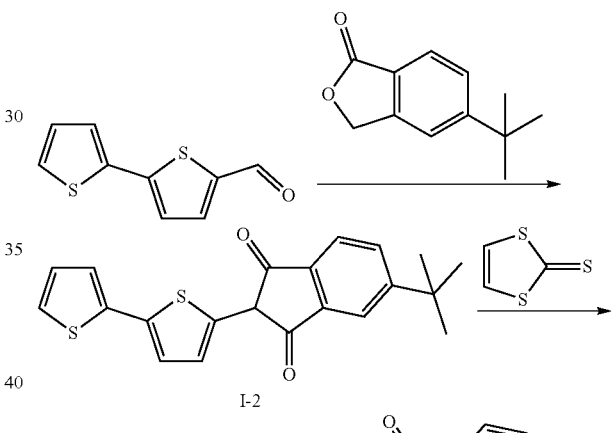

[Reaction Scheme 3]

(1) Synthesis of Compound I-2

2,2'-bithiophene-5-carbaldehyde (5.1 g, 26.3 mmol), 5-(tert-butyl)isobenzofuran-1(3H)-one (5.0 g, 26.3 mmol), and sodium ethoxide (21 wt % in ethanol, 20.6 mL, 55.2 mmol) are dissolved in 150 mL of ethanol and 30 mL of ethyl acetate and then, stirred at 80° C. for 24 hours. When a reaction is completed, the resultant is dissolved again in 200 mL of H$_2$O after all evaporating organic solvents, and 60 mL of 1N HCl is slowly added thereto to precipitate a material. The precipitated material is filtered and then, separated and purified through silica gel column chromatography (acetone:chloroform=1:10 (a volume ratio)), obtaining 8.3 g of Compound I-2. A yield is 86%.

NMR (500 MHz, CDCl$_3$): 8.09 (s, 1H), 8.01 (s, 2H), 7.27 (d, 1H), 7.19 (d, 1H), 7.12 (d, 1H), 7.04 (t, 1H), 7.00 (d, 1H), 4.52 (s, 1H), 1.44 (s, 9H).

(2) Synthesis of Compound C 1,3-dithiole-2-thione (0.2 g, 1.5 mmol) and dimethyl sulfate (0.2 g, 1.6 mmol) are dissolved in 15 mL of acetic acid and then, stirred at 90° C. for 2 hours. Subsequently, Compound I-2 (10.9 g, 49 mmol) is dissolved in a mixed solvent of 6 mL of acetic acid and 3 mL of triethylamine, and this solution is added to the resultant and then, stirred at 90° C. for 12 hours. When a reaction is completed, the resultant is poured into 200 mL of ethanol and then, filtered. A product therefrom is three times more purified through reprecipitation in ethanol and finally, purified through sublimation, obtaining Compound C.

NMR (500 MHz, DMSO-$d_6$): 8.03 (d, 1H), 7.92 (m, 2H), 7.74 (s, 2H), 7.59 (d, 1H), 7.58 (d, 1H), 7.51 (s, 1H), 7.44 (d, 1H), 1.32 (s, 9H).

Synthesis Example 4

[Compound D]

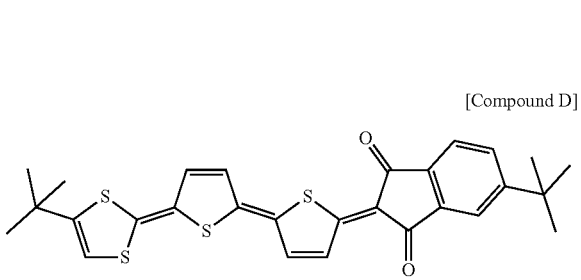 [SMILES: CC(C)(C)C1=CS/C(=c2/cc/c(=c3/cc/c(=C4/C(=O)c5ccc(C(C)(C)C)cc5C4=O)s3)s2)S1]

[Reaction Scheme 4]

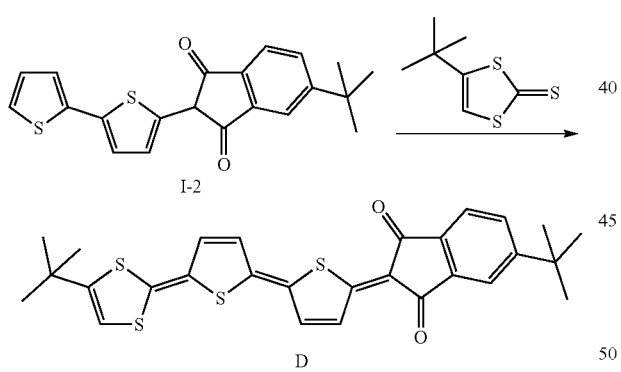

4-(tert-butyl)-1,3-dithiole-2-thione (0.5 g, 2.6 mmol) and dimethyl sulfate (0.4 g, 2.9 mmol) are dissolved in 20 mL of acetic acid and then, stirred at 90° C. for 2 hours. Subsequently, Compound I-2 (0.9 g, 2.4 mmol) is dissolved in a mixed solvent of 10 mL of acetic acid and 5 mL of triethylamine, and this solution is added to the first reactants and then, stirred at 90° C. for 12 hours. When a reaction is completed, the resultant is poured into 200 mL of $H_2O$ and then, separated and purified through silica gel column chromatography (acetone:chloroform=1:10 (a volume ratio)), obtaining Compound D.

NMR (500 MHz, CDCl$_3$): 8.30 (d, 1H), 7.86 (s, 1H), 7.67 (d, 1H), 7.64 (d, 1H), 7.60 (d, 1H), 7.18 (d, 1H), 7.07 (d, 1H), 6.35 (s, 1H), 1.38 (s, 9H), 1.35 (s, 9H).

Synthesis Example 5

[Compound E]

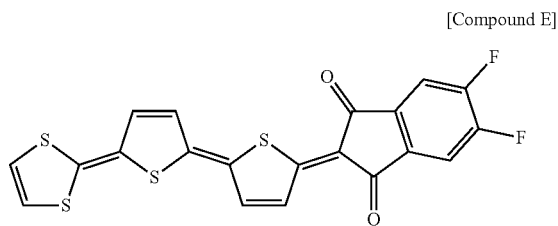 [SMILES: O=C1C(=c2cc/c(=c3/ccc(=C4SC=CS4)s3)s2)C(=O)c2cc(F)c(F)cc21]

[Reaction Scheme 5]

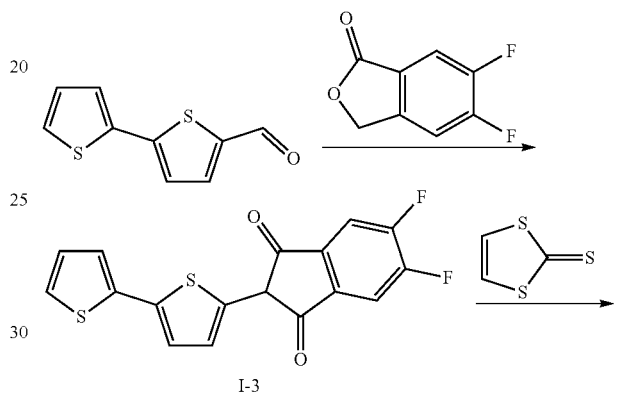

(1) Synthesis of Compound I-3

2,2'-bithiophene-5-carbaldehyde (5.7 g, 29.4 mmol), 5,6-difluoroisobenzofuran-1(3H)-one (5.0 g, 29.4 mmol), and sodium ethoxide (21 wt % in ethanol, 23.0 mL, 61.7 mmol) are dissolved in 150 mL of ethanol and 30 mL of ethyl acetate and then, stirred at 80° C. for 24 hours. When a reaction is completed, the resultant is dissolved again in 200 mL of $H_2O$ after all evaporating organic solvents, and 70 mL of 1N HCl is slowly added thereto to precipitate a material. The precipitated material is filtered and then, separated and purified through silica gel column chromatography (acetone:chloroform=1:10 (in a volume ratio)), obtaining 7.4 g of Compound I-3. A yield is 73%.

NMR (500 MHz, DMSO-$d_6$): 7.47 (d, 1H), 7.31 (d, 1H), 7.13 (d, 1H), 7.10 (m, 2H), 7.07 (d, 1H), 7.01 (t, 1H), 4.41 (m, 1H).

(2) Synthesis of Compound E 1,3-dithiole-2-thione (0.2 g, 1.6 mmol) and dimethyl sulfate (0.2 g, 1.7 mmol) are dissolved in 15 mL of acetic acid and then, stirred at 90° C. for 2 hours. Subsequently, Compound I-3 (0.5 g, 1.4 mmol) is dissolved in a mixed solvent of 10 mL of acetic acid and 5 mL of triethylamine, and this solution is added to the first reactants and then, stirred at 90° C. for 12 hours. When a reaction is completed, the resultant is poured into 500 mL of acetone and then, filtered. A product therefrom is three times more purified through reprecipitation in acetone and finally, purified through sublimation, obtaining Compound E.

NMR (500 MHz, DMSO-$d_6$): 8.10 (d, 1H), 8.00 (d, 1H), 7.98 (s, 2H), 7.84 (d, 1H), 7.61 (d, 1H), 7.43 (t, 2H).

Synthesis Example 6

[Compound F]

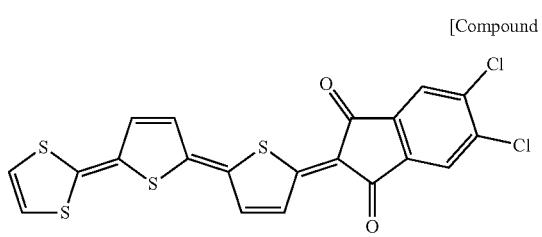

[Reaction Scheme 6]

NMR (500 MHz, DMSO-$d_6$): 7.50 (d, 1H), 7.30 (d, 1H), 7.18 (s, 2H), 7.09 (d, 1H), 7.06 (d, 1H), 7.01 (t, 1H), 4.48 (s, 1H).

(2) Synthesis of Compound F 1,3-dithiole-2-thione (0.2 g, 1.5 mmol) and dimethyl sulfate (0.2 g, 1.6 mmol) are dissolved in 15 mL of acetic acid and then, stirred at 90° C. for 2 hours. Subsequently, Compound I-4 (0.5 g, 1.3 mmol) is dissolved in a mixed solvent of 10 mL of acetic acid and 5 mL of triethylamine, and this solution is added to the first reactants and then, stirred at 90° C. for 12 hours. When a reaction is completed, the resultant is poured into 500 mL of acetone and then, filtered. A product therefrom is three times more purified through reprecipitation in acetone and finally, purified through sublimation, obtaining Compound F.

MALDI-TOF-MS: 477.91 m/z

Synthesis Example 7

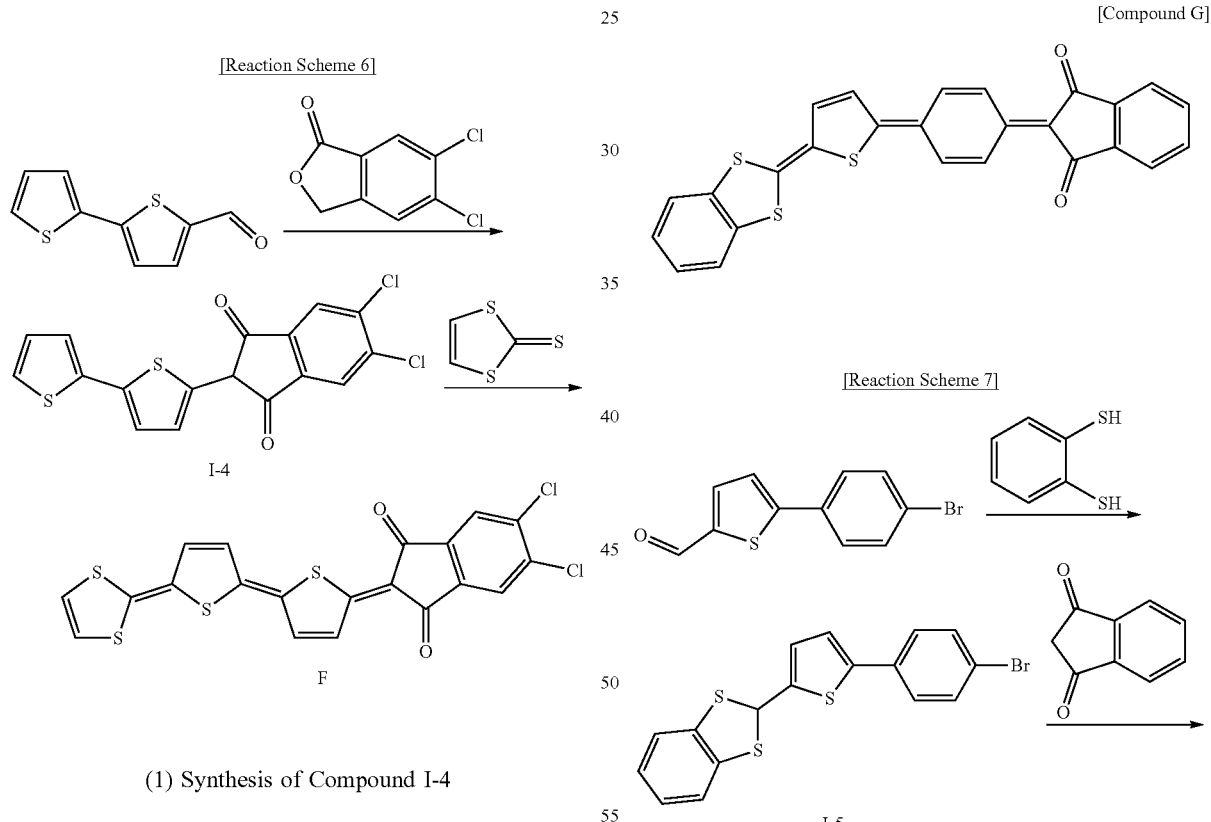

(1) Synthesis of Compound I-4

2,2'-bithiophene-5-carbaldehyde (4.8 g, 24.6 mmol), 5,6-dichloroisobenzofuran-1(3H)-one (5.0 g, 24.6 mmol), and sodium ethoxide (21 wt % in ethanol, 19.3 mL, 51.7 mmol) are dissolved in 150 mL of ethanol and 30 mL of ethyl acetate and then, stirred at 80° C. for 24 hours. When a reaction is completed, the resultant is dissolved again in 200 mL of $H_2O$ after all evaporating organic solvents, and 60 mL of 1N HCl is slowly added thereto to precipitate a material. The precipitated material is filtered and then, separated and purified through silica gel column chromatography (acetone: chloroform=1:10 (in a volume ratio)), obtaining 8.4 g of Compound I-4. A yield is 90%.

(1) Synthesis of Compound I-5

5-(4-bromophenyl)thiophene-2-carbaldehyde (4.1 g, 15.4 mmol), benzene-1,2-dithiol (2.2 g, 15.4 mmol), and p-toluenesulfonic acid monohydrate (1.5 g, 7.7 mmol) are dissolved in 150 mL of toluene and then, stirred at 120° C. for 5 hours. When a reaction is completed, 100 mL of a saturated sodium bicarbonate aqueous solution (sat. $NaHCO_3$ (aq.)) is added thereto and then, stirred, extracted with $H_2O$/chloroform, and separated and purified through silica gel column chromatography (chloroform:n-hexane=1:4 (in a volume ratio)), obtaining 3.7 g of Compound I-5. A yield is 62%.

NMR (500 MHz, $CDCl_3$): 7.48 (d, 2H), 7.41 (d, 2H), 7.26 (m, 2H), 7.10 (m, 2H), 7.07 (s, 2H), 6.33 (s, 1H).

(2) Synthesis of Compound G

Compound I-5 (1.7 g, 4.3 mmol), 1H-indene-1,3(2H)-dione (0.7 g, 4.8 mmol), palladium acetate (0.05 g, 0.2 mmol), SPhos (0.2 g, 0.4 mmol), and potassium phosphate tribasic (1.8 g, 8.7 mmol) are dissolved in 20 mL of 1,4-dioxane and then, stirred at 100° C. for 24 hours. When a reaction is completed, the resultant is dissolved again in 100 mL of $H_2O$ after all evaporating organic solvents, and 20 mL of 1N HCl is slowly added thereto to precipitate a material. The precipitated material is dissolved again in 50 mL of chloroform, a p-chloranil saturated solution is slowly added thereto for oxidation and then, three times more reprecipitated in acetone, obtaining Compound G.

MALDI-TOF-MS: 455.13

Synthesis Example 8

[Compound H]

[Reaction Scheme 8]

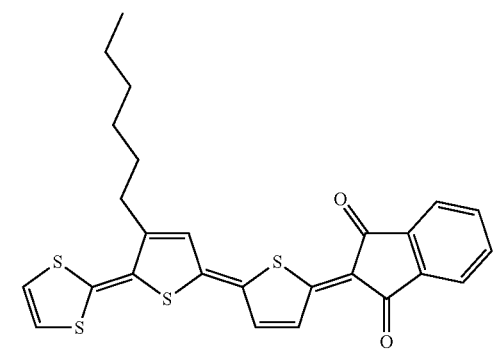

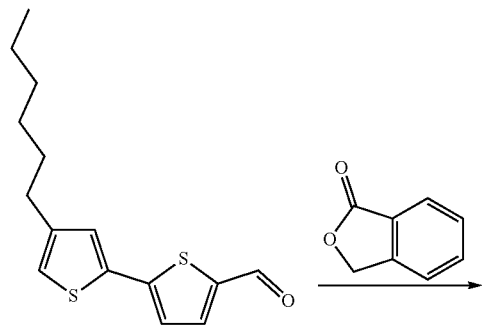

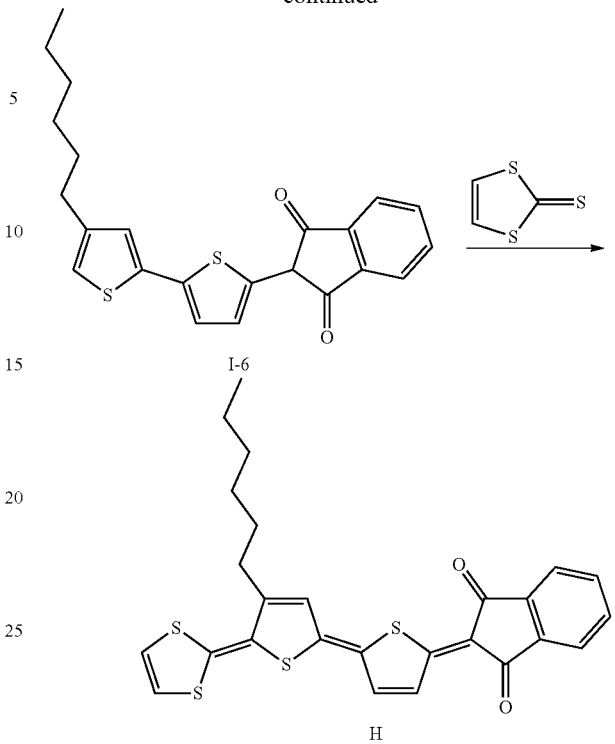

(1) Synthesis of Compound I-6

4'-hexyl-[2,2'-bithiophene]-5-carbaldehyde (2.2 g, 7.9 mmol), phthalide (1.1 g, 7.9 mmol), and sodium ethoxide (21 wt % in ethanol, 6.8 mL, 18.2 mmol) are dissolved in 50 mL of ethanol and 10 mL of ethyl acetate and then, stirred at 80° C. for 24 hours. When a reaction is completed, the resultant is dissolved again in 100 mL of $H_2O$ after all evaporating organic solvents, and 20 mL of 1N HCl is slowly added thereto to precipitate a material. The precipitated material is filtered and then, separated and purified through silica gel column chromatography (acetone:chloroform=1:10 (in a volume ratio)), obtaining 1.5 g of Compound I-6. A yield is 48%.

NMR (500 MHz, $CDCl_3$): 8.10 (m, 2H), 7.93 (m, 2H), 7.04 (d, 1H), 7.00 (d, 1H), 6.99 (s, 1H), 6.79 (s, 1H), 4.48 (s, 1H), 2.56 (t, 2H), 1.61 (m, 2H), 1.35 (m, 2H), 1.31 (m, 4H), 0.89 (t, 3H).

(2) Synthesis of Compound H 1,3-dithiole-2-thione (0.38 g, 2.8 mmol) and dimethyl sulfate (0.39 g, 3.1 mmol) are dissolve in 30 mL of acetic acid and then, stirred at 90° C. for 2 hours. Subsequently, Compound I-6 (1.0 g, 2.5 mmol) is dissolved in a mixed solvent of 20 mL of acetic acid and 10 mL of triethylamine, and this solution is added to the first reactants and then, stirred at 90° C. for 12 hours. When a reaction is completed, 200 mL of $H_2O$ is added thereto to precipitate a material and then, filtered. The precipitated material is separated and purified through silica gel column chromatography (acetone:chloroform=1:4 (in a volume ratio)) and finally, purified through sublimation, obtaining Compound H.

LC-MS: 495.03

Synthesis Example 9

[Compound I]

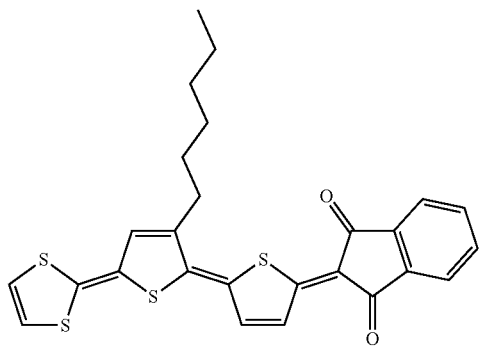

[Reaction Scheme 9]

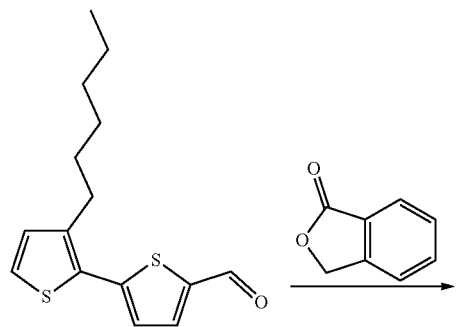

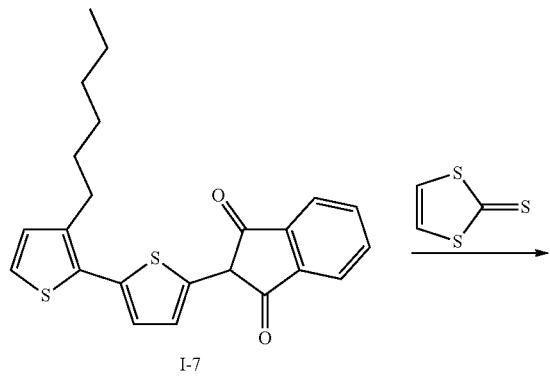

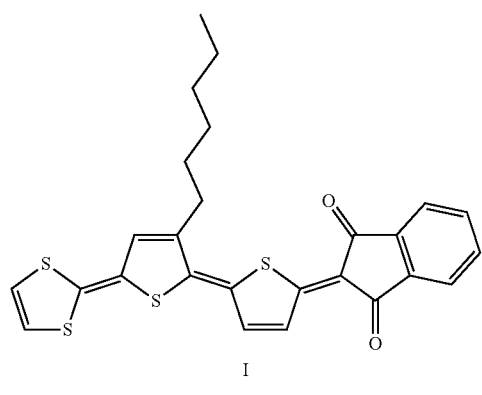

(1) Synthesis of Compound I-7

3'-hexyl-[2,2'-bithiophene]-5-carbaldehyde (2.2 g, 7.9 mmol), phthalide (1.1 g, 7.9 mmol), and sodium ethoxide (21 wt % in ethanol, 6.8 mL, 18.2 mmol) are dissolved in 50 mL of ethanol and 10 mL of ethyl acetate and then, stirred at 80° C. for 24 hours. When a reaction is completed, the resultant is dissolved again in 100 mL of $H_2O$ after all evaporating organic solvents, and 20 mL of 1N HCl is slowly added thereto to precipitate a material. The precipitated material is filtered and then, separated and purified through silica gel column chromatography (acetone:chloroform=1:10 (in a volume ratio)), obtaining 1.8 g of Compound I-7 (Intermediate). A yield is 58%.

NMR (500 MHz, $CDCl_3$): 8.10 (m, 2H), 7.94 (m, 2H), 7.17 (d, 1H), 7.04 (d, 1H), 7.00 (d, 1H), 6.93 (d, 1H), 4.51 (s, 1H), 2.72 (t, 2H), 1.61 (m, 2H), 1.36 (m, 2H), 1.29 (m, 4H), 0.89 (t, 3H).

(2) Synthesis of Compound I 1,3-dithiole-2-thione (0.38 g, 2.8 mmol) and dimethyl sulfate (0.39 g, 3.1 mmol) are dissolved in 30 mL of acetic acid and then, stirred at 90° C. for 2 hours. Subsequently, Compound I-7 (1.0 g, 2.5 mmol) is dissolved in a mixed solvent of 20 mL of acetic acid and 10 mL of triethylamine, and this solution is added to the first reactants and then, stirred at 90° C. for 12 hours. When a reaction is completed, the resultant is poured into 200 mL of ethanol and then, filtered. A product therefrom is three times more purified through reprecipitation in ethanol and finally purified through sublimation, obtaining Compound I.

NMR (500 MHz, DMSO-$d_6$): 7.92 (d, 1H), 7.88 (s, 2H), 7.87 (s, 1H), 7.82 (d, 1H), 7.51 (m, 2H), 7.44 (m, 2H), 2.84 (t, 2H), 1.68 (m, 2H), 1.45 (m, 2H), 1.34 (m, 4H), 0.89 (t, 3H).

Synthesis Example 10

[Compound J]

[Reaction Scheme 10]

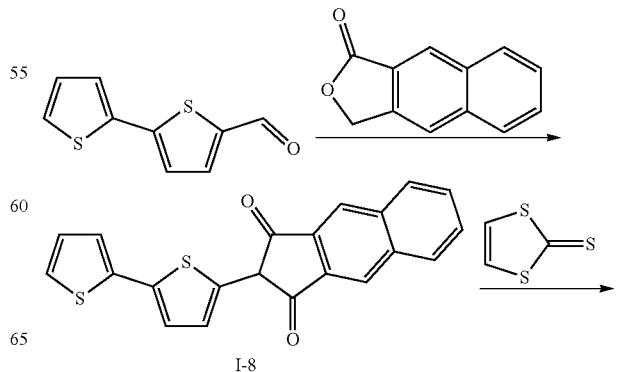

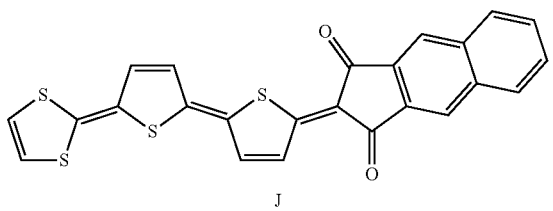

J (1) Synthesis of Compound I-8

2,2'-bithiophene-5-carbaldehyde (5.3 g, 27 mmol), naphtho[2,3-c]furan-1(3H)-one (5.0 g, 27 mmol), and sodium ethoxide (21 wt % in ethanol, 23.4 mL, 69 mmol) are dissolved in 150 mL of ethanol and 30 mL of ethyl acetate and then, stirred at 80° C. for 24 hours. When a reaction is completed, the resultant is dissolved again in 200 mL of H$_2$O after all evaporating organic solvents, and 70 mL of 1N HCl is slowly added thereto to precipitate a material. The precipitated material is filtered and dissolved in 500 mL of chloroform to remove all the soluble portions, and then, an insoluble material is filtered, obtaining 2.8 g of Compound I-8 (Intermediate). A yield is 29%.

NMR (500 MHz, DMSO-d$_6$): 7.93 (m, 2H), 7.81 (s, 2H), 7.70 (d, 1H), 7.52 (m, 2H), 7.44 (dd, 1H), 7.27 (dd, 1H), 7.24 (d, 1H), 7.08 (t, 1H).

(2) Synthesis of Compound J 1,3-dithiole-2-thione (0.34 g, 2.5 mmol) and dimethyl sulfate (0.34 g, 2.7 mmol) are dissolved in 30 mL of acetic acid and then, stirred at 90° C. for 2 hours. Subsequently, Compound I-8 (0.75 g, 2.1 mmol) is dissolved in a mixed solvent of 10 mL of acetic acid and 5 mL of triethylamine, and this solution is added to the first reactants and then, stirred at 90° C. for 12 hours. When a reaction is completed, the resultant is poured into 500 mL of acetone and then, filtered. A product therefrom is three times more purified through reprecipitation in acetone and finally purified through sublimation, obtaining Compound J.

MALDI-TOF-MS: 459.18

Synthesis Example 11

[Compound K]

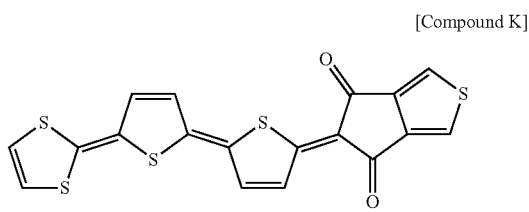 [SMILES: O=C1C(=c2cc/c(=c3/ccc(=C4SC=CS4)s3)s2)C(=O)c2cscc21]

[Reaction Scheme 11]

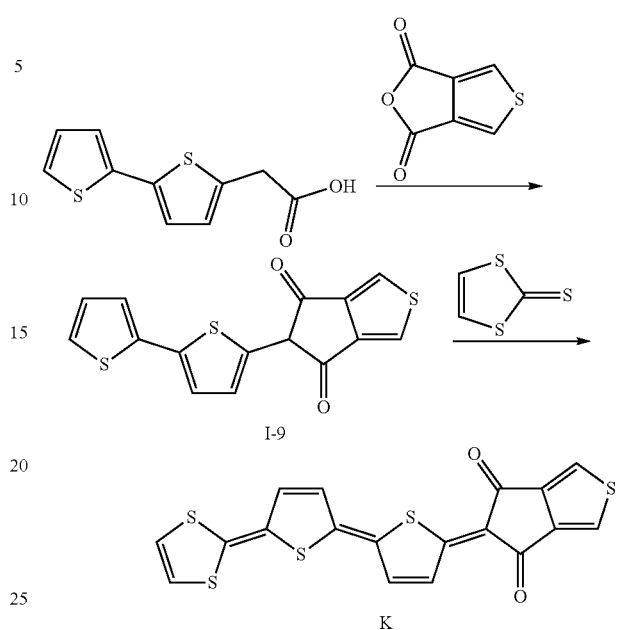

(1) Synthesis of Compound I-9

2-([2,2'-bithiophen]-5-yl)acetic acid (2.3 g, 10 mmol) and thieno[3,4-c]furan-1,3-dione (1.6 g, 10 mmol) are dissolved in 4 mL of acetic anhydride and 4 mL of triethylamine and then, stirred at 100° C. for 6 hours. Subsequently, sodium ethoxide (21 wt % in ethanol, 30 mL, 82 mmol), 50 mL of ethanol, and 10 mL of ethyl acetate are further added thereto and then, stirred at 80° C. for 24 hours. When a reaction is completed, the resultant is dissolved again in 300 mL of H$_2$O after all evaporating organic solvents, and 100 mL of 1N HCl is slowly added thereto to precipitate a material. The precipitated material is filtered and then, separated and purified through silica gel column chromatography (acetone:chloroform=1:10 (in a volume ratio)), obtaining 1.2 g of Compound I-9. A yield is 37%.

NMR (500 MHz, DMSO-d$_6$): 7.54 (d, 1H), 7.39 (s, 2H), 7.38 (d, 1H), 7.19 (d, 1H), 7.15 (d, 1H), 7.04 (t, 1H).

(2) Synthesis of Compound K 1,3-dithiole-2-thione (0.34 g, 2.5 mmol) and dimethyl sulfate (0.34 g, 2.7 mmol) are dissolved in 30 mL of acetic acid and then, stirred at 90° C. for 2 hours. Subsequently, Compound I-9 (0.67 g, 2.1 mmol) is dissolved in a mixed solvent of 10 mL of acetic acid and 5 mL of triethylamine, and this solution is added to the first reactants and then, stirred at 90° C. for 12 hours. When a reaction is completed, the resultant is poured into 500 mL of acetone and then, filtered. A product therefrom is three times more purified through reprecipitation in acetone and finally, purified through sublimation, obtaining Compound K.

MALDI-TOF-MS: 414.87

Evaluation I

Light absorption characteristics of the compounds according to Synthesis Examples are evaluated.

The light absorption characteristics are evaluated from a peak absorption wavelength ($\lambda_{peak,A}$) by dissolving each compound of Synthesis Examples in dimethyl sulfoxide (DMSO) at a concentration of $1\times10^{-5}$ M and measuring a peak absorption wavelength ($\lambda_{peak,A}$) of the solution with a UV-Vis-NIR spectrometer (UV-3600 Plus UV-Vis-NIR, Shimadzu Scientific Instruments).

The results are shown in Table 1.

TABLE 1

|  | $\lambda_{peak,A}$ (nm) |
| --- | --- |
| Synthesis Example 1 | 852 |
| Synthesis Example 2 | 858 |
| Synthesis Example 3 | 858 |
| Synthesis Example 4 | 866 |
| Synthesis Example 5 | 840 |
| Synthesis Example 6 | 832 |
| Synthesis Example 7 | 840 |
| Synthesis Example 8 | 823 |
| Synthesis Example 9 | 868 |
| Synthesis Example 10 | 858 |
| Synthesis Example 11 | 855 |

Referring to Table 1, the compounds according to Synthesis Examples 1 to 11 exhibit a peak absorption wavelength ($\lambda_{peak,A}$) in a wavelength region of about 750 nm to 1000 nm.

Evaluation II

The compounds according to Synthesis Examples are evaluated with respect to heat resistance properties.

The heat resistance properties are evaluated through thermogravimetric analysis (TGA) by measuring a temperature at which a weight of a sample is reduced by 10% compared with the initial weight, while the temperature is increased under a high vacuum of 10 Pa or less.

The results are shown in Table 2.

TABLE 2

|  | $T_{s\,(10)}$ (° C.) |
| --- | --- |
| Synthesis Example 1 | 290 |
| Synthesis Example 2 | 250 |
| Synthesis Example 3 | 240 |
| Synthesis Example 6 | 380 |
| Synthesis Example 7 | 330 |
| Synthesis Example 8 | 240 |
| Synthesis Example 9 | 230 |

\* $T_s(10)$ (° C.): a temperature at which a weight of a sample is reduced by 10% compared with the initial weight.

Referring to Table 2, the compounds according to Synthesis Examples 1 to 9 all exhibit the weight reduction of 10% relative to the initial weight at about 500° C. or less (about 400° C. or less) and thus turn out to be a vapor-depositable compound which is well sublimed at a relatively low temperature.

Manufacture of Infrared Sensor

Example 1-1

ITO (10 nm), Ag (a reflective layer, 50 nm), and ITO (10 nm) are sequentially deposited on a glass substrate to form a first electrode with an ITO/Ag/ITO structure. Subsequently, a triphenylamine derivative is deposited on the first electrode to form a 10 nm-thick lower buffer layer. On the lower buffer layer, the compound (P-type semiconductor) according to Synthesis Example 1 and a counter material C60 (N-type semiconductor) are co-deposited in a volume ratio (a thickness ratio) of 1:2.5 to form a 210 nm-thick infrared photoelectric conversion layer. On the infrared photoelectric conversion layer, C60 is deposited to form a 5 nm-thick upper buffer layer, and then, a 5 nm-thick ytterbium (Yb) and a 30 nm-thick silver (Ag) layer are sequentially deposited thereon to form a second electrode (semi-transmissive electrode).

Subsequently, on the second electrode, 50 nm-thick aluminum oxide ($Al_2O_3$) and 200 nm-thick silicon oxynitride (SiON) are sequentially formed, manufacturing an infrared sensor.

Example 1-2

An infrared sensor is manufactured in the same manner as Example 1-1 except that a 15 nm-thick upper buffer layer is formed instead of the 5 nm-thick upper buffer layer.

Example 2

An infrared sensor is manufactured in the same manner as Example 1-1 except that the compound of Synthesis Example 2 is used instead of the compound according to Synthesis Example 1.

Example 3

An infrared sensor is manufactured in the same manner as Example 1-1 except that the compound of Synthesis Example 3 is used instead of the compound according to Synthesis Example 1.

Example 4

An infrared sensor is manufactured in the same manner as Example 1-1 except that the compound of Synthesis Example 4 is used instead of the compound according to Synthesis Example 1.

Example 5

An infrared sensor is manufactured in the same manner as Example 1-1 except that the compound of Synthesis Example 5 is used instead of the compound according to Synthesis Example 1.

Example 6

An infrared sensor is manufactured in the same manner as Example 1-1 except that the compound of Synthesis Example 6 is used instead of the compound according to Synthesis Example 1.

Example 7

An infrared sensor is manufactured in the same manner as Example 1-1 except that the compound of Synthesis Example 7 is used instead of the compound according to Synthesis Example 1.

Example 8

An infrared sensor is manufactured in the same manner as Example 1-1 except that the compound of Synthesis Example 8 is used instead of the compound according to Synthesis Example 1.

Example 9

An infrared sensor is manufactured in the same manner as Example 1-1 except that the compound of Synthesis Example 9 is used instead of the compound according to Synthesis Example 1.

Example 10

An infrared sensor is manufactured in the same manner as Example 1-1 except that the compound of Synthesis Example 10 is used instead of the compound according to Synthesis Example 1.

Example 11

An infrared sensor is manufactured in the same manner as Example 1-1 except that the compound of Synthesis Example 11 is used instead of the compound according to Synthesis Example 1.

Evaluation III

Electrical characteristics of the infrared sensors according to Examples are evaluated.

The electrical characteristics of the infrared sensors according to Examples are evaluated from a peak EQE wavelength ($\lambda_{peak,EQE}$) which indicates peak external quantum efficiency ($EQE_{peak}$) of an infrared sensor.

The EQE is measured by using an IPCE measurement system (TNE Tech Co., Ltd., Korea). First, the IPCE measurement system is calibrated by using an Si photodiode (Hamamatsu Photonics K.K., Japan), and the infrared sensor is mounted thereon to measure the EQE in a wavelength region of about 400 nm to about 1400 nm and evaluate the peak EQE wavelength ($\lambda_{peak,EQE}$) indicating the peak external quantum efficiency ($EQE_{peak}$).

The results are shown in Table 3.

TABLE 3

|  | $\lambda_{peak,EQE}$ (nm) | $EQE_{peak}$ (%) |
| --- | --- | --- |
| Example 1-1 | 1180 | 12.8 |
| Example 1-2 | 1210 | 9.4 |

Referring to Table 3, wavelengths of the infrared sensors according to Examples, which indicates the peak external quantum efficiency, shift toward a longer wavelength region than the peak absorption wavelengths of the compounds according to Synthesis Examples. Herein, the wavelengths indicating the peak external quantum efficiency correspond to a peak absorption wavelength of a deposited thin film. Accordingly, the compounds according to Synthesis Examples exhibit much improved molecular alignment and crystallinity during the deposition, so that the absorption wavelength region thereof shift toward a long wavelength region and simultaneously, more shift toward the long wavelength region due to a microcavity structure of the infrared sensors.

While the inventive concepts have been described in connection with what is presently considered to be practical example embodiments, it is to be understood that the inventive concepts are not limited to such example embodiments, but, on the contrary, are intended to cover various modifications and equivalent arrangements included within the spirit and scope of the appended claims.

What is claimed is:

1. A sensor, comprising:
a first electrode,
a second electrode, and
an infrared photoelectric conversion layer between the first electrode and the second electrode, the infrared photoelectric conversion layer including a compound represented by Chemical Formula 1:

[Chemical Formula 1]

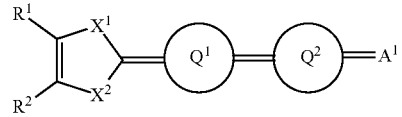

wherein, in Chemical Formula 1,
$Q^1$ and $Q^2$ are each independently a substituted or unsubstituted C3 to C30 quinoid ring,
$X^1$ and $X^2$ are each independently O, S, Se, Te, or $NR^a$,
$R^1$, $R^2$, and $R^a$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof,
$R^1$ and $R^2$ are each independently present or are linked to each other to form a ring, and
$A^1$ is a cyclic group represented by Chemical Formula A,

[Chemical Formula A]

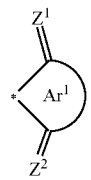

wherein, in Chemical Formula A,
$Ar^1$ is a substituted or unsubstituted C6 to C30 aryl group, a substituted or unsubstituted C3 to C30 heteroaryl group, or a fused ring thereof,
$Z^1$ and $Z^2$ are each independently O, S, Se, Te, or $CR^bR^c$, wherein $R^b$ and $R^c$ are each independently hydrogen, a substituted or unsubstituted C1 to C30 alkyl group, or a cyano group, and
\* is a linking point with Chemical Formula 1.

2. The sensor of claim 1, wherein $Q^1$ and $Q^2$ each independently comprise at least one substituted or unsubstituted 5-membered quinoid ring, at least one substituted or unsubstituted 6-membered quinoid ring, or a fused ring thereof.

3. The sensor of claim 1, wherein $Q^1$ and $Q^2$ are each independently one group of a plurality of groups listed in Group 1:

[Group 1]

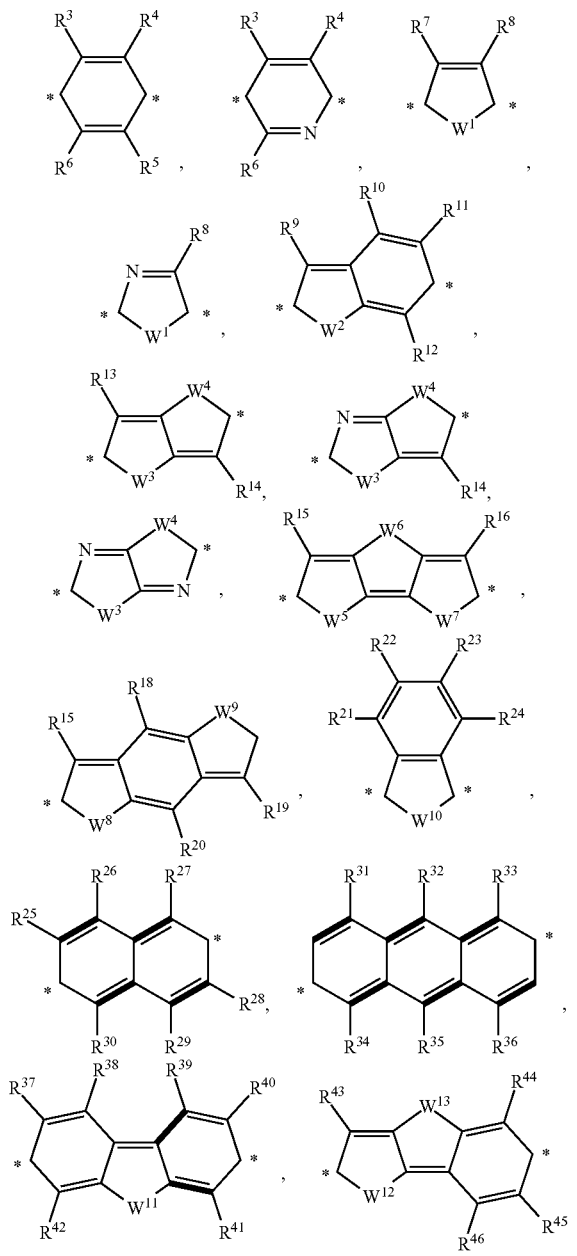

wherein, in Group 1,
$W^1$ to $W^{13}$ are each independently O, S, Se, or Te,
$R^3$ to $R^{46}$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof,
$R^3$ to $R^{46}$ are each independently present or $R^3$ to $R^{46}$ are linked to each other to form a ring, and
* is a linking point with Chemical Formula 1.

4. The sensor of claim 1, wherein $X^1$ and $X^2$ are each S.

5. The sensor of claim 1, wherein $A^1$ is represented by one of Chemical Formulas A-1 to A-7:

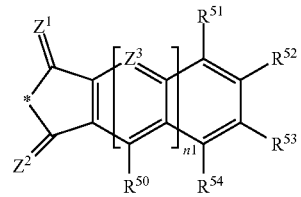
[Chemical Formula A-1]

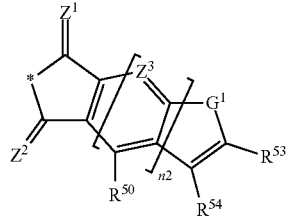
[Chemical Formula A-2]

[Chemical Formula A-3]

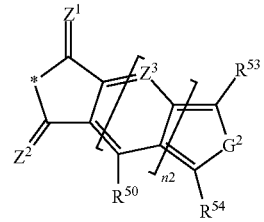
[Chemical Formula A-4]

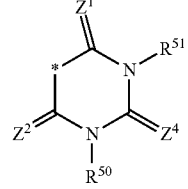
[Chemical Formula A-5]

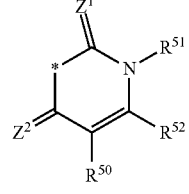
[Chemical Formula A-6]

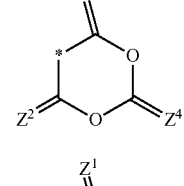
[Chemical Formula A-7]

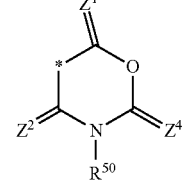

wherein, in Chemical Formulas A-1 to A-7,
$Z^1$, $Z^2$, and $Z^4$ are each independently O, S, Se, Te, or $CR^bR^c$, wherein $R^b$ and $R^c$ are each independently hydrogen, a substituted or unsubstituted C1 to C30 alkyl group, or a cyano group, $Z^3$ is N or $CR^d$, $G^1$ and $G^2$ are each independently O, S, Se, or Te, $R^{50}$ to $R^{54}$ and $R^d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, $R^{50}$ to $R^{54}$ are each independently present or two adjacent ones of $R^{50}$ to $R^{54}$ are linked to each other to form a ring, n1 to n3 are each independently an integer of 0 to 2, and

* is a linking point with Chemical Formula 1.

6. The sensor of claim 1, wherein $A^1$ is represented by one of Chemical Formulas A-1a to A-7b:

[Chemical Formula A-1a]

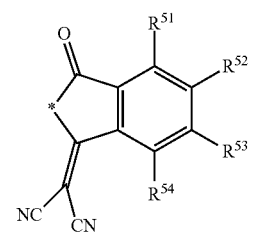

[Chemical Formula A-1b]

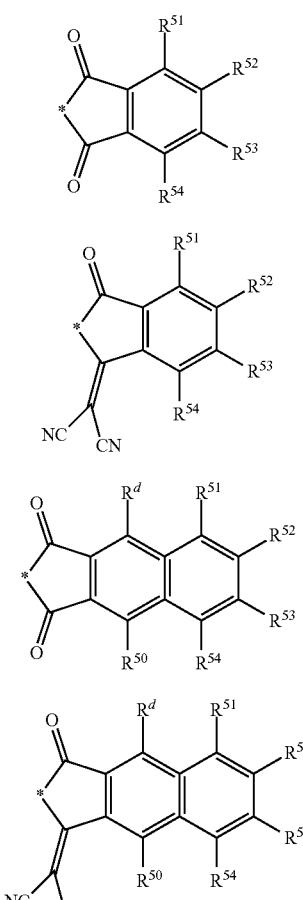

[Chemical Formula A-1c]

[Chemical Formula A-1d]

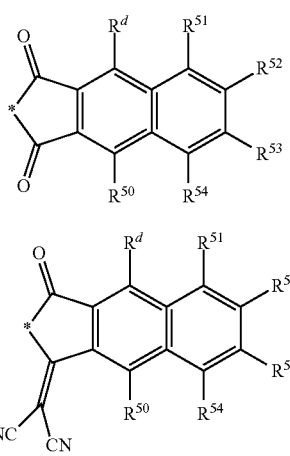

[Chemical Formula A-2a]

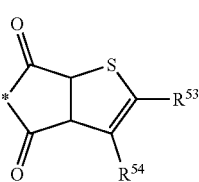

[Chemical Formula A-2b]

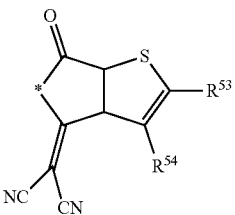

[Chemical Formula A-2c]

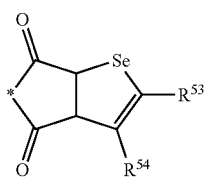

[Chemical Formula A-2d]

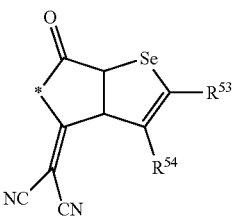

[Chemical Formula A-2e]

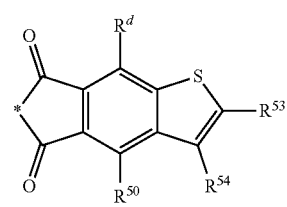

[Chemical Formula A-2f]

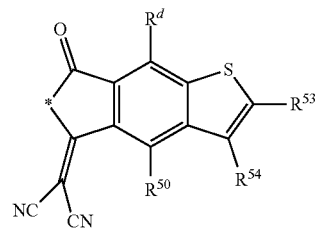

[Chemical Formula A-2g]

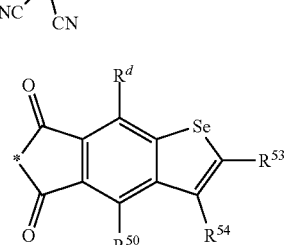

[Chemical Formula A-2h]

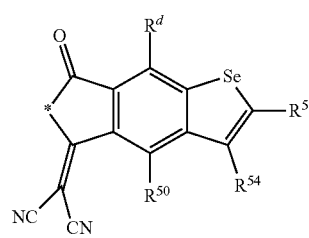

[Chemical Formula A-3a]
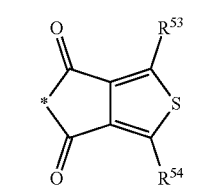
[Chemical Formula A-3b]
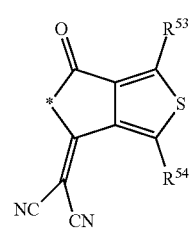
[Chemical Formula A-3c]
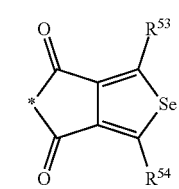
[Chemical Formula A-3d]
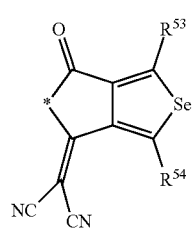
[Chemical Formula A-3e]
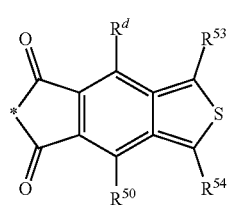
[Chemical Formula A-3f]
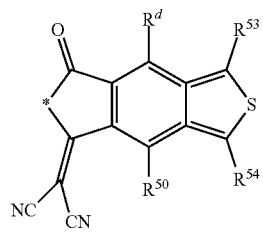
[Chemical Formula A-3g]
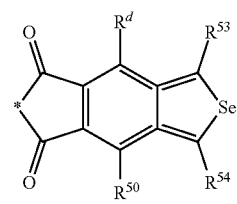
[Chemical Formula A-3h]
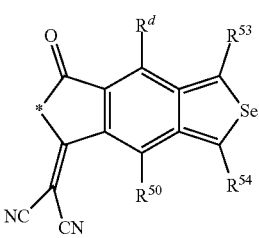
[Chemical Formula A-4a]
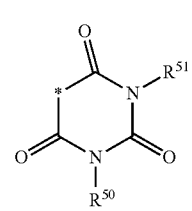
[Chemical Formula A-4b]
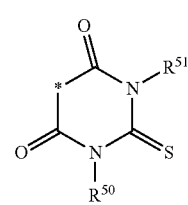
[Chemical Formula A-5a]
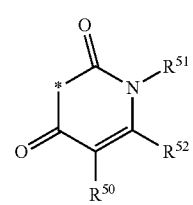
[Chemical Formula A-6a]
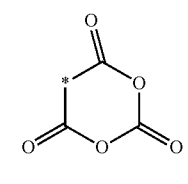
[Chemical Formula A-6b]
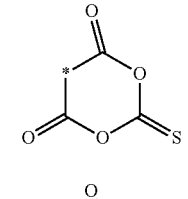
[Chemical Formula A-7a]
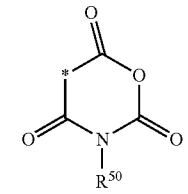

-continued

[Chemical Formula A-7b]

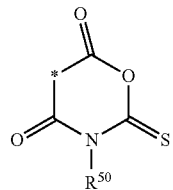

wherein, in Chemical Formulas A-1a to A-7b,
$R^{50}$ to $R^{54}$ and $R^d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof,
$R^{50}$ to $R^{54}$ and $R^d$ are each independently present or two adjacent ones of $R^{50}$ to $R^{54}$ and $R^d$ are linked to each other to form a ring, and
* is a linking point with Chemical Formula 1.

7. The sensor of claim 1, wherein the compound is represented by one of Chemical Formulas 2 to 7:

[Chemical Formula 2]

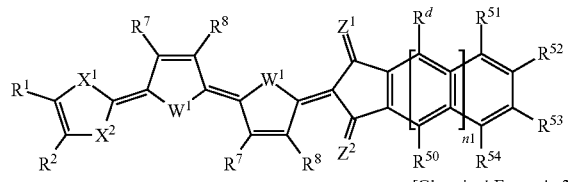

[Chemical Formula 3]

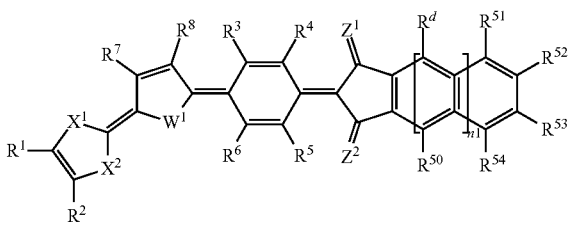

[Chemical Formula 4]

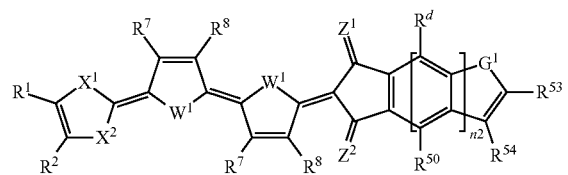

[Chemical Formula 5]

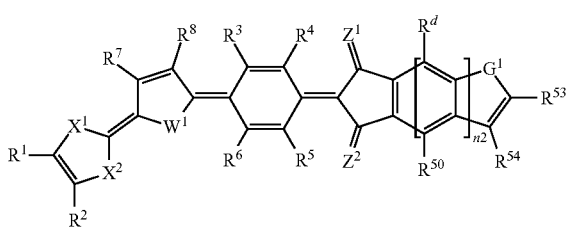

[Chemical Formula 6]

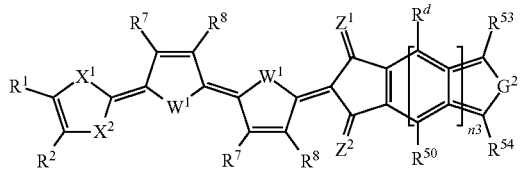

[Chemical Formula 7]

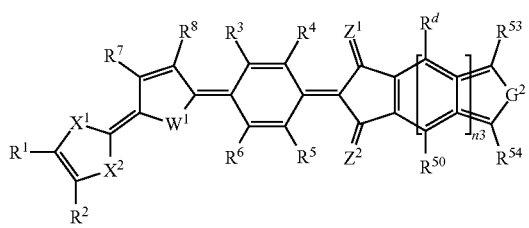

wherein, in Chemical Formulas 2 to 7,
$X^1$ and $X^2$ are each independently O, S, Se, Te, or $NR^a$,
$W^1$, $G^1$, and $G^2$ are each independently O, S, Se, or Te,
$Z^1$ and $Z^2$ are each independently O, S, Se, Te, or $CR^bR^c$, wherein $R^b$ and $R^c$ are each independently hydrogen, a substituted or unsubstituted C1 to C30 alkyl group, or a cyano group,
$R^1$ to $R^8$, $R^{50}$ to $R^{54}$, $R^a$, and $R_d$ are each independently hydrogen, a substituted or unsubstituted C1 to C30 alkyl group, a substituted or unsubstituted C2 to C30 alkenyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a substituted or unsubstituted silyl group, a halogen, a cyano group, or any combination thereof, and
n1 to n3 are each independently an integer of 0 to 2.

8. The sensor of claim 1, wherein a peak absorption wavelength of the sensor belongs to a wavelength region of about 800 nm to about 3000 nm.

9. The sensor of claim 1, wherein the infrared photoelectric conversion layer further comprises a counterpart material that forms a pn junction with the compound.

10. The sensor of claim 1, wherein
the first electrode comprises a reflective layer,
the second electrode comprises a semi-transmissive layer.

11. An electronic device comprising the sensor of claim 1.

12. A sensor, comprising:
a first electrode;
a second electrode; and
an infrared photoelectric conversion layer between the first electrode and the second electrode, wherein
a peak wavelength of an absorption spectrum of the infrared photoelectric conversion layer belongs to about 800 nm to about 3000 nm,
a full width at half maximum (FWHM) of the absorption spectrum of the infrared photoelectric conversion layer is about 100 nm to about 800 nm,
the infrared photoelectric conversion layer includes a compound having a bandgap energy of about 0.5 eV to about 1.5 eV, and a temperature at which a weight loss of the compound of 50% relative to an initial weight of the compound occurs during thermogravimetric analysis of the compound at an ambient pressure of about 0.01 Pa to about 10 Pa is about 300° C. to about 500° C.

13. The sensor of claim 12, wherein the infrared photoelectric conversion layer further comprises a counterpart material that forms a pn junction with the compound.

14. An electronic device comprising the sensor of claim 12.

* * * * *